US012614512B2

(12) United States Patent
Wang et al.

(10) Patent No.: US 12,614,512 B2
(45) Date of Patent: Apr. 28, 2026

(54) DISPLAY SUBSTRATE AND DISPLAY APPARATUS

(71) Applicant: BOE Technology Group Co., Ltd., Beijing (CN)

(72) Inventors: Yawei Wang, Beijing (CN); Fuqiang Li, Beijing (CN); Zhenyu Zhang, Beijing (CN); Ming Yang, Beijing (CN); Zhen Zhang, Beijing (CN); Chenyang Zhang, Beijing (CN); Chuanxiang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 128 days.

(21) Appl. No.: 18/278,013

(22) PCT Filed: Aug. 15, 2022

(86) PCT No.: PCT/CN2022/112533
§ 371 (c)(1),
(2) Date: Aug. 21, 2023

(87) PCT Pub. No.: WO2023/020441
PCT Pub. Date: Feb. 23, 2023

(65) Prior Publication Data
US 2025/0342801 A1 Nov. 6, 2025

(30) Foreign Application Priority Data

Aug. 20, 2021 (CN) .......................... 202110961746.9

(51) Int. Cl.
*G09G 3/3233* (2016.01)
*H10K 59/122* (2023.01)
*H10K 59/131* (2023.01)

(52) U.S. Cl.
CPC ......... *G09G 3/3233* (2013.01); *H10K 59/122* (2023.02); *H10K 59/131* (2023.02);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

2018/0301437 A1* 10/2018 Maki ...................... H05K 1/118
2021/0012706 A1 1/2021 Yang et al.
(Continued)

FOREIGN PATENT DOCUMENTS

CN     110874990 A     3/2020
CN     111785761 A     10/2020
(Continued)

OTHER PUBLICATIONS

International Search Report for PCT/CN2022/112533 Mailed Oct. 24, 2022.

*Primary Examiner* — Stacy Khoo
(74) *Attorney, Agent, or Firm* — Ling Wu; Stephen Yang; Ling and Yang Intellectual Property

(57) ABSTRACT

Disclosed is a display substrate, comprising: a base substrate having a first display region and a second display region, a plurality of first light-emitting elements, a plurality of second light-emitting elements, a plurality of first pixel circuits and a plurality of second pixel circuits. The plurality of first light-emitting elements are located in the first display region, and the plurality of first pixel circuits, the plurality of second pixel circuits and the plurality of second light-emitting elements are located in the second display region. At least one first pixel circuit is configured to use a first data signal to drive at least one electrically connected first
(Continued)

light-emitting element to emit light, and at least one second pixel circuit is configured to use a second data signal to drive at least one electrically connected second light-emitting element to emit light. The first data signal is different from the second data signal.

19 Claims, 11 Drawing Sheets

(52) U.S. Cl.
CPC .............. *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2360/14* (2013.01)

(58) Field of Classification Search
CPC ....... G09G 2300/0861; G09G 2310/08; G09G 2360/01; H10K 59/131; H10K 59/122
See application file for complete search history.

(56) References Cited

U.S. PATENT DOCUMENTS

| | | | |
|---|---|---|---|
| 2022/0069047 A1 | 3/2022 | Yang et al. | |
| 2022/0102421 A1 | 3/2022 | Yang et al. | |
| 2023/0026822 A1 | 1/2023 | Wang et al. | |
| 2024/0074268 A1 * | 2/2024 | Huang | H10K 59/35 |

FOREIGN PATENT DOCUMENTS

| | | | | |
|---|---|---|---|---|
| CN | 111916486 A | 11/2020 | | |
| CN | 112151592 A | 12/2020 | | |
| CN | 112271203 A | 1/2021 | | |
| CN | 113066940 A | 7/2021 | | |
| CN | 115713918 A | 2/2023 | | |
| GB | 2620086 A | 12/2023 | | |
| WO | WO-2017177730 A1 * | 10/2017 | | G09G 3/3258 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/112533 having an international filing date of Aug. 15, 2022, which claims priority to Chinese Patent Application No. 202110961746.9, filed to the CNIPA on Aug. 20, 2021 and entitled "Display Substrate and Display Apparatus". The entire contents of the above-identified applications are hereby incorporated by reference.

TECHNICAL FIELD

The present disclosure relates to, but is not limited to, the field of display technologies, and in particular to a display substrate and a display apparatus.

BACKGROUND

With continuous development of display technologies, a camera is usually installed on a display apparatus to meet shooting needs. In order to maximize a screen-to-body ratio, technologies such as a bangs screen, a water drop screen, and digging hole in a screen have appeared successively. These technologies reduce an area occupied by a camera in a surrounding region by digging a hole locally in a display region and placing the camera under a hole-digging region, thus increasing the screen-to-body ratio. However, the above technologies need to dig out part of the display region, which will cause some regions in a display picture to be unable to be displayed, and make it impossible to further improve the screen-to-body ratio.

SUMMARY

The following is a summary of subject matter described herein in detail. The summary is not intended to limit the protection scope of claims.

Embodiments of the present disclosure provide a display substrate and a display apparatus.

In one aspect, an embodiment of the present disclosure provides a display substrate including a base substrate, a plurality of first light emitting elements, a plurality of second light emitting elements, a plurality of first pixel circuits, and a plurality of second pixel circuits. The base substrate has a first display region and a second display region, and the second display region is located on at least one side of the first display region. The plurality of first light emitting elements are located in the first display region, and the plurality of first pixel circuits, the plurality of second pixel circuits, and the plurality of second light emitting elements are located in the second display region. At least one first pixel circuit among the plurality of first pixel circuits is electrically connected with at least one first light emitting element among the plurality of first light emitting elements through a conductive line. At least one second pixel circuit among the plurality of second pixel circuits is electrically connected with at least one second light emitting element among the plurality of second light emitting elements. An orthographic projection of the at least one second pixel circuit on the base substrate is at least partially overlapped with an orthographic projection of the at least one second light emitting element on the base substrate. The at least one first pixel circuit is configured to use a first data signal to drive the electrically connected at least one first light emitting element to emit light, the at least one second pixel circuit is configured to use a second data signal to drive the electrically connected at least one second light emitting element to emit light. Among them, the first data signal is different from the second data signal.

In some exemplary implementation modes, the at least one first pixel circuit and the at least one second pixel circuit are electrically connected with a same data line, and the data line provides the first data signal and the second data signal in time-sharing.

In some exemplary implementation modes, the at least one first pixel circuit is electrically connected with a first data line, and the at least one second pixel circuit is electrically connected with a second data line, the first data line provides the first data signal, and the second data line provides the second data signal.

In some exemplary implementation modes, a plurality of pixel circuits of the second display region include: a plurality of rows of first pixel circuits arranged along a second direction, and a plurality of rows of second pixel circuits arranged along the second direction. In the second direction, the plurality of rows of first pixel circuits and the plurality of rows of second pixel circuits are arranged at intervals, each row of first pixel circuits includes a plurality of the first pixel circuits arranged sequentially along a first direction, and each row of the second pixel circuits includes a plurality of the second pixel circuits arranged sequentially along the first direction. The first direction intersects with the second direction.

In some exemplary implementation modes, within the second display region, a plurality of the first pixel circuits arranged along the second direction are electrically connected with a same first data line and a plurality of the second pixel circuits arranged along the second direction are electrically connected with a same second data line.

In some exemplary implementation modes, at least one light emitting element includes: an anode, a cathode, and an organic emitting layer disposed between the anode and the cathode. An area of an anode of the first light emitting element is smaller than or equal to an area of an anode of a second light emitting element which emits light of a same color.

In some exemplary implementation modes, the base substrate further includes a third display region, and the third display region at least partially surrounds the first display region and the second display region. The display substrate further includes a plurality of third pixel circuits and a plurality of third light emitting elements located in the third display region. At least one third pixel circuit among the plurality of third pixel circuits is electrically connected with at least one third light emitting element among the plurality of third light emitting elements. An orthographic projection of the at least one third pixel circuit on the base substrate is at least partially overlapped with an orthographic projection of the at least one third light emitting element on the base substrate. A ratio of an area of an anode of the first light emitting element to an area of an anode of a third light emitting element which emits light of a same color is greater than or equal to 30% and less than or equal to 80%.

In some exemplary implementation modes, an orthographic projection of the anode of the first light emitting element on the base substrate is elliptical or circular, and an orthographic projection of the anode of the third light emitting element on the base substrate is hexagonal or pentagonal.

In some exemplary implementation modes, resolutions of the third display region, the second display region, and the first display region are substantially the same.

In some exemplary implementation modes, the second data line is electrically connected with a column of second pixel circuits in the second display region, extends along a second direction to the third display region, and is electrically connected with a column of third pixel circuits within the third display region. The first data line is electrically connected with a column of first pixel circuits in the second display region, and extends from a gap between the first display region and the second display region to the third display region, and is electrically connected with a column of third pixel circuits within the third display region.

In some exemplary implementation modes, the second data line is electrically connected with a column of second pixel circuits in the second display region, extends along a second direction to the third display region, and is electrically connected with a column of third pixel circuits within the third display region. The first data line includes a first sub-data line and a second sub-data line. The first sub-data line is electrically connected with a column of first pixel circuits in the second display region, extends to the third display region along the second direction, and is electrically connected with the second sub-data line through a data connection line in the third display region. The second sub-data line is electrically connected with a column of third pixel circuits within the third display region.

In some exemplary implementation modes, the data connection line is located in the third display region and extends along a first direction.

In some exemplary implementation modes, the plurality of first light emitting elements of the first display region and the plurality of second light emitting elements of the second display region are divided into a plurality of light emitting element groups, and light emitting elements within each of the light emitting element groups are configured to emit light of a same color. At least one light emitting element group among the plurality of light emitting element groups includes a plurality of sub light emitting element groups, and at least one sub light emitting element group among the plurality of sub light emitting element groups includes at least two adjacent light emitting elements, anodes of the at least two adjacent light emitting elements are connected through a connection line.

In some exemplary implementation modes, extension directions of a plurality of data lines connected with a same light emitting element group are substantially parallel; or, a plurality of data lines connected with a same light emitting element group are divided into a plurality of connection line groups, each of the connection line groups includes a plurality of connection lines which are arranged sequentially along a first direction and have substantially parallel extension directions; extension directions of connection lines of adjacent connection line groups intersect.

In some exemplary implementation modes, the plurality of light emitting element groups include: a green light emitting element group, a red light emitting element group, and a blue light emitting element group. Extension directions of a plurality of connection lines electrically connected with the green light emitting element group are substantially parallel; extension directions of connection lines of adjacent connection line groups among a plurality of connection line groups connected with the red light emitting element group intersect; extension directions of connection lines of adjacent connection line groups among a plurality of connection line groups connected with the blue light emitting element group intersect.

In some exemplary implementation modes, the connection lines are made of a transparent conductive material.

In some exemplary implementation modes, the display substrate further includes a black first pixel definition layer located in the first display region, wherein the first pixel definition layer is at least partially located on a side of an anode of the first light emitting element away from the base substrate. The first pixel definition layer includes a plurality of first pixel definition blocks that are independent of each other; a plurality of first pixel definition blocks of the first display region correspond to anodes of the plurality of first light emitting elements one by one, and the first pixel definition blocks have first pixel definition openings exposing anodes of corresponding first light emitting elements.

In some exemplary implementation modes, an orthographic projection of the first pixel definition openings on the base substrate is in a shape of a circular ring.

In another aspect, an embodiment of the present disclosure provides a display apparatus, which includes the aforementioned display substrate.

In some exemplary implementation modes, the display apparatus further includes: a photosensitive sensor located on a side of the display substrate, and an orthographic projection of the photosensitive sensor on the display substrate is overlapped with a first display region of the display substrate.

Other aspects may be understood upon reading and understanding accompanying drawings and detailed description.

BRIEF DESCRIPTION OF DRAWINGS

The accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1A:
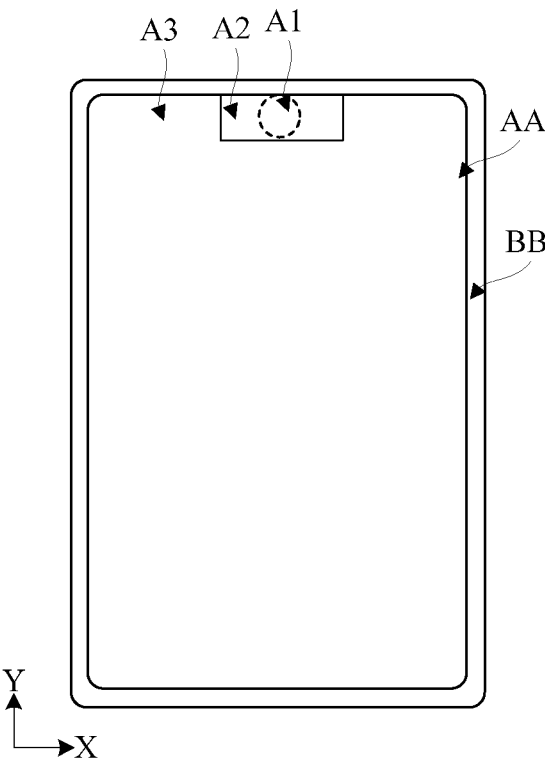
FIG. 1A is a schematic diagram of a display substrate according to at least one embodiment of the present disclosure.

The embodiments of the present disclosure will be described below with reference to the drawings in detail. Implementation modes may be implemented in a plurality of different forms. Those skilled in the art may easily understand a fact that a mode and content may be changed into other forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion between constituent elements, but not to set a limit in quantity. In the present disclosure, "plurality" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with a plurality functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, a first electrode may be a drain electrode and a second electrode may be a source electrode, or, the first electrode may be a source electrode and the second electrode may be a drain electrode. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A "light transmission rate" in the present disclosure refers to an ability of light passing through a medium, and is a percentage of luminous flux passing through a transparent or translucent body to its incident luminous flux.

In the present disclosure, "about" and "substantially" refer to that a boundary is not defined strictly and a case within a range of a process and measurement error is allowed. In the present disclosure, "substantially the same" refers to a case where numerical values differ by less than 10%.

An embodiment of the present disclosure provides a display substrate, which includes a base substrate, a plurality of first light emitting elements, a plurality of first pixel circuits, a plurality of second pixel circuits, and a plurality of second light emitting elements. The base substrate has a first display region and a second display region, and the second display region is located on at least one side of the first display region. The plurality of first light emitting elements are located in the first display region. The plurality of first pixel circuits, the plurality of second pixel circuits, and the plurality of second light emitting elements are located in the second display region. At least one first pixel circuit among the plurality of first pixel circuits is electrically connected with at least one first light emitting element among the plurality of first light emitting elements through a conductive line, and at least one second pixel circuit among the plurality of second pixel circuits is electrically connected with at least one second light emitting element among the plurality of second light emitting elements. An orthographic projection of the at least one second pixel circuit on the base substrate is at least partially overlapped with an orthographic projection of the at least one second light emitting element on the base substrate. The at least one first pixel circuit is configured to use a first data signal to drive the electrically connected at least one first light emitting element to emit light; the at least one second pixel circuit is configured to use a second data signal to drive the electrically connected at least one second light emitting element to emit light. Among them, the first data signal is different from the second data signal.

In some exemplary implementation modes, one first pixel circuit is electrically connected with two first light emitting elements with a same color, and one second pixel circuit is electrically connected with two second light emitting elements with a same color. However, this embodiment is not limited thereto.

In the display substrate provided by the embodiment, a first light emitting element and a first pixel circuit in the first display region are separately disposed to achieve full-screen display. Moreover, a first pixel circuit drives a first light emitting element to emit light, a second pixel circuit drives a second light emitting element to emit light, and by providing different data signals to the first pixel circuit and the second pixel circuit, a display effect may be ensured.

In some exemplary implementation modes, at least one first pixel circuit and at least one second pixel circuit are electrically connected with a same data line, and the same data line provides the first data signal and the second data signal in time-sharing. In this example, the first data signal and the second data signal are provided through a data line in time-sharing, and the first light emitting element and the second light emitting element are driven to emit light using different data signals.

In some exemplary implementation modes, at least one first pixel circuit is electrically connected with a first data line, and at least one second pixel circuit is electrically connected with a second data line, the first data line provides a first data signal, and the second data line provides a second data signal. In this example, different data signals are provided through two kinds of data lines to drive a first light emitting element and ae second light emitting element to emit light respectively.

In some exemplary implementation modes, the plurality of pixel circuits of the second display region include a plurality of rows of first pixel circuits arranged along a second direction, and a plurality of rows of second pixel circuits arranged along a second direction. In the second direction, the plurality of rows of first pixel circuits and the plurality of rows of second pixel circuits are arranged at intervals, each row of first pixel circuits include a plurality of first pixel circuits sequentially arranged along the first direction, and each row of second pixel circuits include a plurality of second pixel circuits sequentially arranged along the first direction. The first direction intersects with the second direction. In this example, the plurality of pixel circuits of the second display region may be arranged in an array. For example, the plurality of first pixel circuits are arranged in even-numbered rows and the plurality of second pixel circuits are arranged in odd-numbered rows. However, this embodiment is not limited thereto.

In some exemplary implementation modes, at least one light emitting element includes an anode, a cathode, and an organic emitting layer disposed between the anode and the cathode. An area of an anode of a first light emitting element may be less than or equal to an area of an anode of a second light emitting element which emits light of a same color. In some examples, aiming for the first light emitting element and the second light emitting element which emit light of a same color, the area of the anode of the first light emitting element is set to be smaller than the area of the anode of the second light emitting element, and a light transmittance of the first display region may be improved. In some examples, the area of the anode of the first light emitting element may be substantially the same as the area of the anode of the second light emitting element which emits light of a same color, and the area of the anode of the first light emitting element may be smaller than an area of an anode of a third light emitting element which emits light of a same color. However, this embodiment is not limited thereto.

In some exemplary implementation modes, the base substrate further includes a third display region that at least partially surrounds the first display region and the second display region. The display substrate may further include a plurality of third pixel circuits and a plurality of third light emitting elements located in the third display region. At least one third pixel circuit among the plurality of third pixel circuits is electrically connected with at least one third light emitting element among the plurality of third light emitting elements, and an orthographic projection of the at least one third pixel circuit on the base substrate is at least partially overlapped with an orthographic projection of the at least one third light emitting element on the base substrate. A ratio of an area of an anode of a first light emitting element to an area of a anode of a third light emitting element which emits light of a same color may be greater than or equal to 30% and less than or equal to 80%. In some examples, the ratio of the area of the anode of the first light emitting element to the area of the anode of the third light emitting element which emits light of a same color may be greater than or equal to 40%, and less than or equal to 70%. For example, a ratio of areas of anodes of the two may be 40%, 50%, 60%, or 70%. However, this embodiment is not limited thereto.

In some examples, the plurality of third pixel circuits in the third display region are electrically connected with the plurality of third light emitting elements in one-to-one correspondence. Arrangements and structures of the third pixel circuits in the third display region and pixel circuits in the second display region may be substantially the same, and arrangements and structures of the third light emitting elements and second light emitting elements may be substantially the same. However, this embodiment is not limited thereto.

In some exemplary implementation modes, an orthographic projection of an anode of a first light emitting element on the base substrate may be elliptical or circular, and an orthographic projection of an anode of a third light emitting element on the base substrate may be hexagonal or pentagonal. In this example, by performing a smoothing design on a shape of an anode of a first light emitting element of the first display region, diffraction of a camera below the display substrate when shooting may be reduced, thereby improving a shooting effect.

In some exemplary implementation modes, resolutions of the third display region, the second display region, and the first display region may be substantially the same. However, this embodiment is not limited thereto. For example, a resolution of the first display region may be less than a resolution of the second display region, and the resolution of the second display region may be less than or equal to a resolution of the third display region.

In some exemplary implementation modes, a plurality of first light emitting elements of the first display region and a plurality of second light emitting elements of the second display region are divided into a plurality of light emitting element groups, and light emitting elements within each of the light emitting element groups are configured to emit light of a same color. At least one light emitting element group among the plurality of light emitting element groups includes a plurality of sub light emitting element groups, and at least one sub light emitting element group among the plurality of sub light emitting element groups includes at least two adjacent light emitting elements, and anodes of the at least two adjacent light emitting elements are connected through a connection line. For example, anodes of at least two light emitting elements of a same color adjacent in the first direction may be connected v a connection line, or anodes of at least two light emitting elements of a same color adjacent in the second direction may be connected through a connection line. However, this embodiment is not limited thereto. In this example, in the first display region and the second display region, by connecting anodes of at least two adjacent light emitting elements of a same color, it is possible to achieve that a single pixel circuit drives at least two light emitting elements of a same color to emit light.

In some exemplary implementation modes, extension directions of a plurality of data lines connected with a same light emitting element group are substantially parallel. Or, a plurality of data lines connected with a same light emitting element group are divided into a plurality of connection line groups, each connection line group includes a plurality of connection lines which are arranged sequentially along the first direction and have substantially parallel extension directions; extension directions of connection lines of adjacent connection line groups intersect.

In some exemplary implementation modes, a connection line connecting adjacent first light emitting elements of a same color and a conductive line electrically connecting a first pixel circuit and a first light emitting element may be of an integral structure. Or, the conductive line may be located on a side of the connection line close to the base substrate. However, this embodiment is not limited thereto.

In some exemplary implementation modes, the display substrate may further include a black first pixel definition layer located in the first display region. The first pixel definition layer is at least partially located on a side of an anode of a first light emitting element away from the base substrate. The first pixel definition layer includes a plurality of first pixel definition blocks independent of each other. The plurality of first pixel definition blocks in the first display region correspond to anodes of a plurality of first light emitting elements one by one, and a first pixel definition block has a first pixel definition opening exposing an anode of a corresponding first light emitting element. In this example, by providing a black first pixel definition layer in the first display region, diffraction may be reduced, and a shooting effect of a camera under the display substrate may be optimized.

Solutions of the embodiments will be described below through some examples.

Figure 1B:
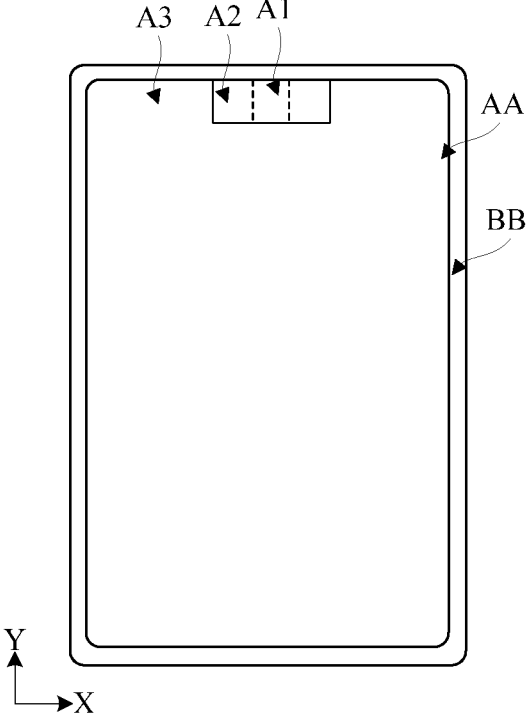
FIG. 1B is another schematic diagram of a display substrate according to at least one embodiment of the present disclosure.

FIG. 1A is a schematic diagram of a display substrate according to at least one embodiment of the present disclosure. FIG. 1B is another schematic diagram of a display substrate according to at least one embodiment of the present disclosure. In some exemplary implementation modes, as shown in FIGS. 1A and 1B, the display substrate includes a display region AA and a bezel region BB located around the display region AA. The display region AA may include a first display region A1, a second display region A2, and a third display region A3. The second display region A2 may be located on at least one side of the first display region A1. The third display region A3 is located on at least one side of the first display region A1 and the second display region A2. A region within the display region AA other than the first display region A1 and the second display region A2 is the third display region A3. In some examples, the first display region A1 may also be referred to as an Under Display Camera (UDC) region, the second display region A2 may also be referred to as a function guarantee region, and the third display region A3 may also be referred to as a normal display region. However, this embodiment is not limited thereto.

In some exemplary implementation modes, as shown in FIGS. 1A and 1B, the first display region A1 and the second display region A2 may be located directly in a middle of a top of the display substrate. However, this embodiment is not limited thereto. For example, the first display region A1 and the second display region A2 may be located at other positions, such as an upper left corner or an upper right corner of the display substrate.

In some exemplary implementation modes, as shown in FIGS. 1A and 1B, the second display region A2 may be located on opposite sides of the first display region A1 in a first direction X. However, this embodiment is not limited thereto. For example, the second display region may be located on a side of the first display region in a first direction, or may be located on at least one side of the first display region in a second direction.

In some exemplary implementation modes, as shown in FIGS. 1A and 1B, the display region AA may be in a shape of a rectangle, e.g., a rounded rectangle. As shown in FIG. 1A, the first display region A1 may be circular or elliptical.

As shown in FIG. 1B, the first display region A1 may be rectangular. However, this embodiment is not limited thereto. For example, the first display region may be in another shape, such as a shape of a quadrangle or pentagon.

In some exemplary implementation modes, the first display region A1 may be a light-transmitting display region. For example, an orthographic projection of hardware such as a photosensitive sensor (e.g., a camera) on the display substrate may be located in the first display region A1 of the display substrate. In this example, the display substrate does not need to be punched, and under a premise of ensuring practicability of the display substrate, a true full screen may be made possible. In some examples, as shown in FIG. 1A, the first display region A1 may be circular and a size of the orthographic projection of the photosensitive sensor on the display substrate may be less than or equal to a size of the first display region A1. In some other examples, as shown in FIG. 1B, the first display region A1 may be rectangular, and a size of the orthographic projection of the photosensitive sensor on the display substrate may be less than or equal to a size of an inscribed circle of the first display region A1. However, this embodiment is not limited thereto.

In some exemplary implementation modes, the display substrate may include a plurality of sub-pixels disposed on a base substrate, and at least one sub-pixel may include a pixel circuit and a light emitting element. The pixel circuit is configured to drive the light emitting element. For example, the pixel circuit is configured to provide a drive current for driving the light emitting element to emit light. For example, the light emitting element may be an Organic Light Emitting Diode (OLED), and the light emitting element emits red light, green light, blue light, or white light, etc. under drive of its corresponding pixel circuit. A color of light emitted from the light emitting element may be determined as required.

In some exemplary implementation modes, in order to improve a light transmittance of the first display region A1, it is possible to dispose only a light emitting element in the first display region A1, and dispose a pixel circuit for driving the light emitting element of the first display region A1 in the second display region A2. That is, a light transmittance of the first display region A1 is improved by separately disposing the light emitting element and the pixel circuit. In this example, in the first display region A1, no pixel circuit is disposed.

Figure 2A:
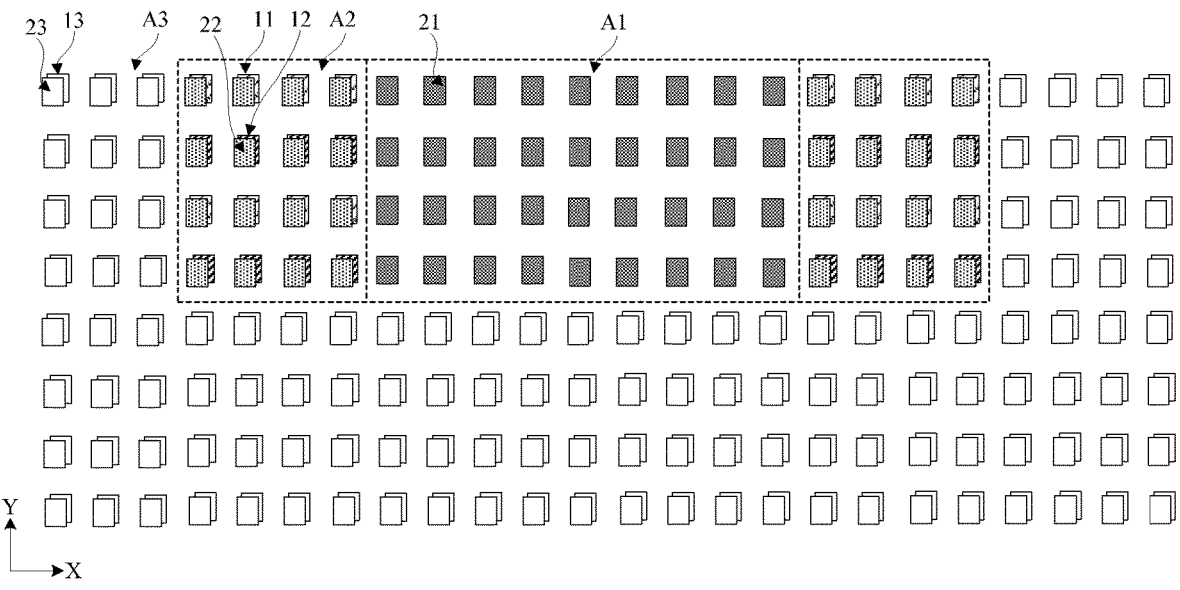
FIG. 2A is a schematic diagram of an arrangement of pixel circuits and light emitting elements of a display substrate according to at least one embodiment of the present disclosure.

FIG. 2A is a schematic diagram of an arrangement of pixel circuits and light emitting elements of a display substrate according to at least one embodiment of the present disclosure.

Figure 2B:
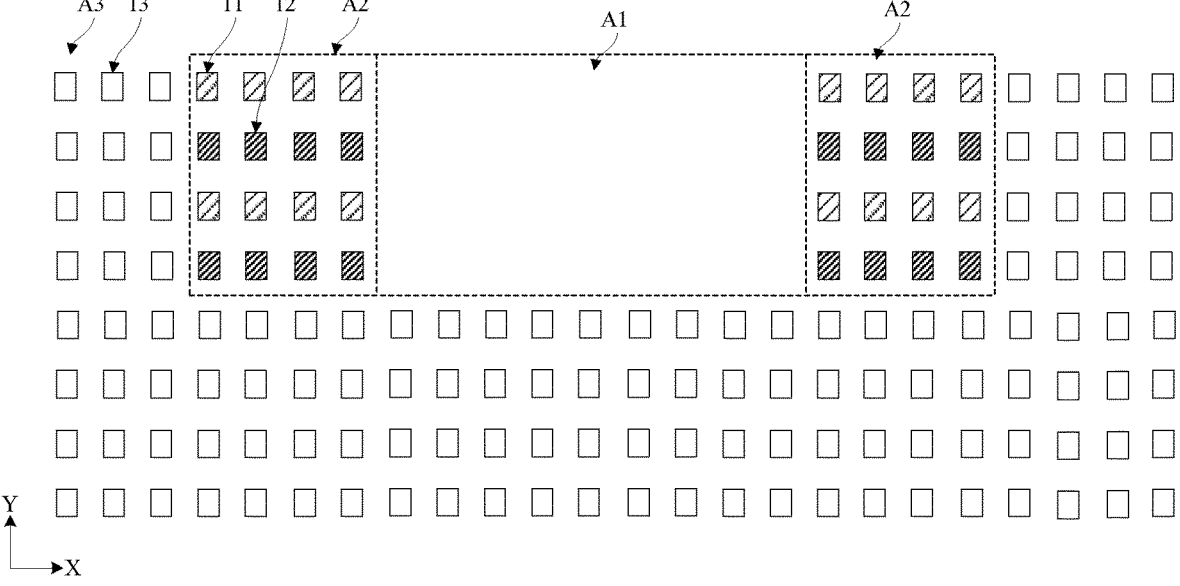
FIG. 2B is a schematic diagram of an arrangement of pixel circuits of a display substrate according to at least one embodiment of the present disclosure.
Figure 2C:
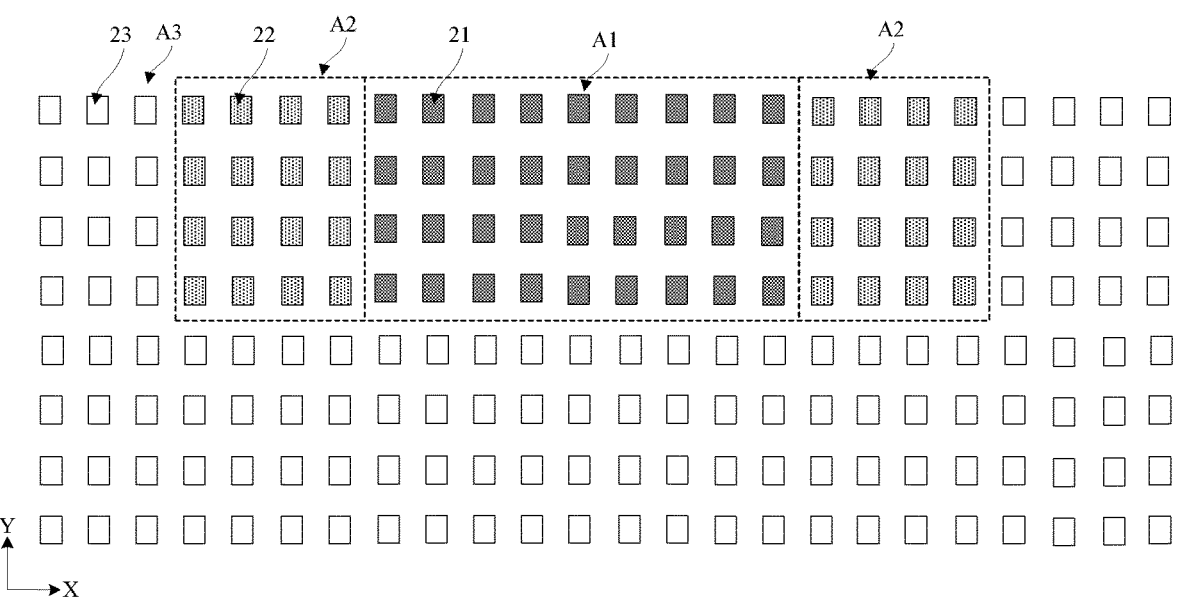
FIG. 2C is a schematic diagram of an arrangement of light emitting elements of a display substrate according to at least one embodiment of the present disclosure.

FIG. 2B is a schematic diagram of an arrangement of pixel circuits of a display substrate according to at least one embodiment of the present disclosure. FIG. 2C is a schematic diagram of an arrangement of light emitting elements of a display substrate according to at least one embodiment of the present disclosure. In this example, description is made by taking a case in which a first display region A1 is rectangular as an example.

In some exemplary implementation modes, as shown in FIG. 2A to FIG. 2C, the display substrate may include a plurality of first light emitting elements 21, a plurality of second light emitting elements 22, a plurality of third light emitting elements 23, a plurality of first pixel circuits 11, a plurality of second pixel circuits 12, and a plurality of third pixel circuits 13. The plurality of first light emitting elements 21 are located in the first display region A1, the plurality of second light emitting elements 22, the plurality of first pixel circuits 11, and the plurality of second pixel circuits 12 are located in the second display region A2, and the plurality of third light emitting elements 23 and the plurality of third pixel circuits 13 are located in the third display region A3. At least one first pixel circuit 11 is electrically connected with at least one first light emitting element 21 through a conductive line. For example, one first pixel circuit 11 is electrically connected with two first light emitting elements 21 through conductive lines. An orthographic projection of the first pixel circuit 11 on the base substrate may not be overlapped with an orthographic projection of an electrically connected first light emitting element 21 on the base substrate. At least one second pixel circuit 12 is electrically connected with at least one second light emitting element 22. An orthographic projection of the at least one second pixel circuit 12 on the base substrate is at least partially overlapped with an orthographic projection of the at least one second light emitting element 22 on the base substrate. For example, one second pixel circuit 12 is electrically connected with two second light emitting elements 22. An orthographic projection of the second pixel circuit 12 on the base substrate may be overlapped with an electrically connected second light emitting element 22 on the base substrate. At least one third pixel circuit 13 is electrically connected with at least one third light emitting element 23. An orthographic projection of the at least one third pixel circuit 13 on the base substrate is at least partially overlapped with an orthographic projection of the at least one third light emitting element 23 on the base substrate. For example, the plurality of third pixel circuits 13 are electrically connected with the plurality of third light emitting elements 23 in one-to-one correspondence. An orthographic projection of a third pixel circuit 13 on the base substrate is overlapped with an orthographic projection of an electrically connected third light emitting element 23 on the base substrate.

In some exemplary implementation modes, a first pixel circuit 11 of the second display region A2 may be electrically connected with a first light emitting element 21 through a conductive line. The conductive line may extend from the second display region A2 to the first display region A1. One end of the conductive line may be electrically connected with the first pixel circuit in the second display region A2, and the other end of the conductive line may be electrically connected with the first light emitting element 21 in the first display region A1, thereby achieving an electrical connection between the first pixel circuit 11 and the first light emitting element 21. In some examples, the conductive line may be made of a transparent conductive material. For example, the conductive line may be made of a conductive oxide material. For example, the conductive oxide material may include Indium Tin Oxide (ITO). However, this embodiment is not limited thereto.

In some exemplary implementation modes, as shown in FIG. 2A and FIG. 2B, the first display region A1 is not provided with a pixel circuit, and the second display region A2 is provided with a plurality of first pixel circuits and a plurality of second pixel circuits 12. A first pixel circuit 11 may provide a drive signal to a first light emitting element 21 of the first display region A1 to drive the first light emitting element 21 to emit light. A second pixel circuit 12 may provide a drive signal to a second light emitting element 22 of the second display region A2 to drive the second light emitting element 22 to emit light. A third pixel circuit 13 disposed in the third display region A3 may provide a drive signal to a third light emitting element 23 of the third display region A3 to drive the third light emitting element 23 to emit light.

In some exemplary implementation modes, the first display region A1 is a light-transmitting display region, and the second display region A2 and the third display region A3 are non-light-transmitting display regions. That is, the first display region A1 may transmit light, and the second display region A2 and the third display region A3 cannot transmit light. In this way, there is no need to dig a hole on the display substrate, and a required hardware structure such as a photosensitive sensor may be directly disposed below the first display region, which lays a solid foundation for achievement of a true full screen. In addition, since the first display region A1 only includes light emitting elements, and does not include a pixel circuit, it may also ensure that a light transmittance of the first display region A1 is better.

In some exemplary implementation modes, as shown in FIGS. 2A and 2B, a plurality of pixel circuits of the second display region A2 are arranged in an array. The plurality of pixel circuits of the second display region A2 include a plurality of rows of first pixel circuits 11 arranged along a second direction Y and a plurality of rows of second pixel circuits 12 arranged along the second direction Y. In the second direction Y, the plurality of rows of first pixel circuits 11 and the plurality of rows of second pixel circuits 12 are arranged at intervals. Each row of first pixel circuits include a plurality of first pixel circuits 11 sequentially arranged along the first direction X, and each row of second pixel circuits include a plurality of second pixel circuits 12 sequentially arranged along the first direction X. The first direction X intersects with the second direction Y. For example, the first direction X is a pixel circuit row direction, and the second direction Y is a pixel circuit column direction. The first direction X is perpendicular to the second direction Y. However, this embodiment is not limited thereto.

In some exemplary implementation modes, as shown in FIGS. 2A and 2B, a plurality of third pixel circuits 13 of the third display region A3 are arranged in an array. An arrangement manner of the third pixel circuits within the third display region A3 may be consistent with an arrangement manner of pixel circuits within the second display region A2. However, this embodiment is not limited thereto.

In some exemplary implementation modes, as shown in FIG. 2C, arrangement manners of the first light emitting elements 21 within the first display region A1, the second light emitting elements 22 within the second display region A2, and the third light emitting elements 23 within the third display region A3 may be consistent. In some examples, resolutions of the first display region A1, the second display region A2, and the third display region A3 are substantially the same. That is, densities of light emitting elements within the first display region A1, the second display region A2, and the third display region A3 may be substantially the same. In some examples, areas of the first display region A1 and the second display region A2 may be substantially the same, and a quantity of first light emitting elements included in the first display region A1 and a quantity of second light emitting elements included in the second display region A2 may be substantially the same. In this example, there are no two partitions with different densities of light emitting elements in the display region. In this way, when a picture is displayed, there is no light and dark dividing line in the display region, and a display effect is better.

In some exemplary implementation modes, the display region AA is provided with a plurality of pixel units. At least one pixel unit may include two green (G) sub-pixels, one red (R) sub-pixel, and one blue (B) sub-pixel. The two green sub-pixels are sequentially arranged in the second direction Y, and the red sub-pixel and the blue sub-pixel are sequentially arranged in the first direction X. An arrangement manner of GGRB is adopted for sub-pixels of this example. However, this embodiment is not limited thereto. In some examples, one pixel unit may include other colors and other quantities of sub-pixels. For example, one pixel circuit may include three sub-pixels (for example, one red sub-pixel, one green sub-pixel, and one blue sub-pixel), and the three sub-pixels may be arranged side by side horizontally, side by side vertically, or in a manner like a Chinese character "品". For example, one pixel circuit may include four sub-pixels (e.g., one red sub-pixel, one green sub-pixel, one blue sub-pixel, and one white sub-pixel), and the four sub-pixels may be arranged side by side horizontally, side by side vertically, or in a manner to form a square. However, this embodiment is not limited thereto.

Figure 3:
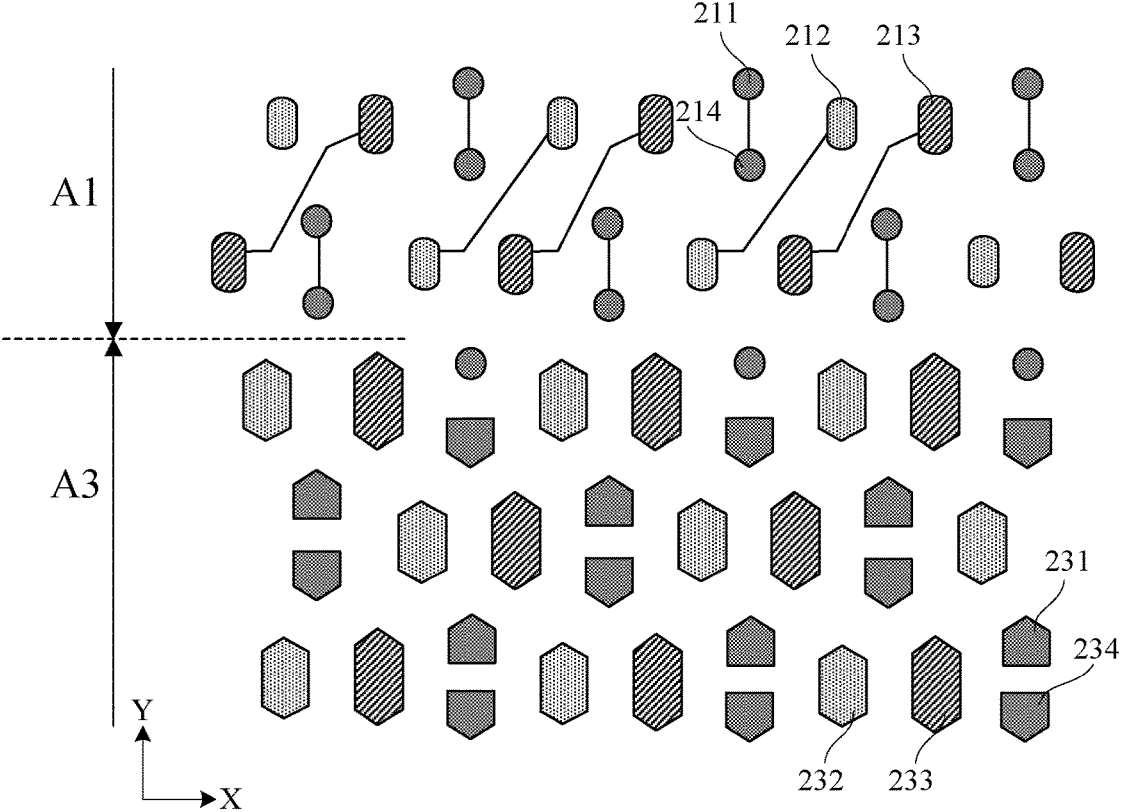
FIG. 3 is a schematic diagram of an arrangement of first light emitting elements in a first display region and third light emitting elements in a third display region according to at least one embodiment of the present disclosure.
Figure 4:
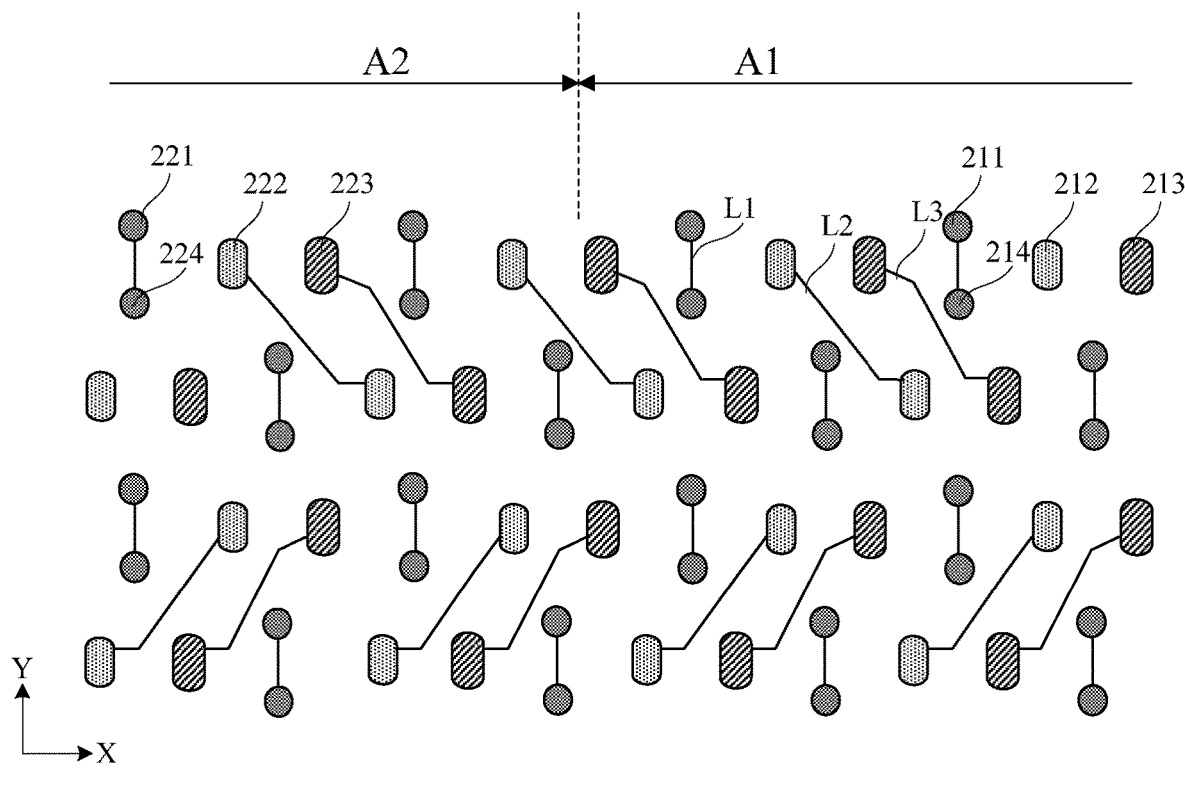
FIG. 4 is a schematic diagram of an arrangement of first light emitting elements in a first display region and second light emitting elements in a second display region according to at least one embodiment of the present disclosure.

FIG. 3 is a schematic diagram of an arrangement of first light emitting elements in a first display region and third light emitting elements in a third display region according to at least one embodiment of the present disclosure. FIG. 4 is a schematic diagram of an arrangement of first light emitting elements in a first display region and second light emitting elements in a second display region according to at least one embodiment of the present disclosure.

In some exemplary implementation modes, as shown in FIG. 3, a plurality of first light emitting elements 21 in a first display region A1 may include: a plurality of green first light emitting elements 211 and 214, a plurality of red first light emitting elements 212, and a plurality of blue first light emitting elements 213. At least one pixel unit of the first display region A1 may include: one blue first light emitting element 213, two green first light emitting elements 211 and 214, and one red first light emitting element 212. The green first light emitting elements 211 and 214 are sequentially arranged in a second direction Y, and the red first light emitting element 212 and the blue first light emitting element 213 are sequentially arranged in a first direction X. Light emitting elements of a same color of adjacent rows are dislocated in the first direction X.

In some exemplary implementation modes, as shown in FIG. 4, a plurality of second light emitting elements 40 in a second display region A2 may include: a plurality of green second light emitting elements 221 and 224, a plurality of red second light emitting elements 222, and a plurality of blue second light emitting elements 223. At least one pixel unit of the second display region A2 may include: one blue second light emitting element 223, two green second light emitting elements 221 and 224, and one red second light emitting element 222. The green second light emitting elements 221 and 224 are sequentially arranged in a second direction Y, and the red second light emitting element 222 and the blue second light emitting element 223 are sequentially arranged in a first direction X. In this example, a shape and an arrangement manner of the plurality of first light emitting elements 21 of a first display region A1 are consistent with a shape and an arrangement manner of the plurality of second light emitting elements 22 of the second display region A2.

In some exemplary implementation modes, as shown in FIG. 3, a plurality of third light emitting elements 40 of the third display region A3 may include: a plurality of green third light emitting elements 231 and 234, a plurality of red third light emitting elements 232, and a plurality of blue third light emitting elements 233. At least one pixel unit of the third display region A3 may include: one blue third light emitting element 233, two green third light emitting elements 231 and 234, and one red third light emitting element 232. The green third light emitting elements 231 and 234 are sequentially arranged in the second direction Y, and the red third light emitting element 232 and blue third light emitting element 233 are sequentially arranged in the first direction X.

In some exemplary implementation modes, at least one light emitting element of a display region AA may include: an anode, a cathode, and an organic emitting layer disposed between the anode and the cathode. As shown in FIG. 3, an area of an anode of a first light emitting element 21 in the first display region A1 is smaller than an area of an anode of a third light emitting element 23 which emits light of a same color in the third display region A3. For example, areas of anodes of the green first light emitting elements 211 and 214 are substantially the same, areas of anodes of the green third light emitting elements 231 and 234 are substantially the same, and an area of an anode of the green first light emitting element 211 is smaller than an area of an anode of the green third light emitting element 231. An area of an anode of the blue first light emitting element 213 is smaller than an area of an anode of the blue third light emitting element 233. An area of an anode of the red first light emitting element 212 is smaller than an area of an anode of the red third light emitting element 232. At a junction of the first display region A1 and the third display region A3, a shape of the green third light emitting element 231 of the third display region A3 may be consistent with a shape of the green first light emitting element 211 of the first display region A1. However, this embodiment is not limited thereto.

In some exemplary implementation modes, a ratio of an area of an anode of the first light emitting element 21 to an area of an anode of the third light emitting element 23 which emits light of a same color may be greater than or equal to 30% and less than or equal to 80%, for example, a ratio of areas of anodes of the two may be greater than or equal to 40% and less than or equal to 70%. For example, the ratio of the area of the anode of the first light emitting element 21 to the area of the anode of the third light emitting element 23 which emits light of a same color may be approximately equal to 40%. In this way, a light transmittance of the first display region A1 may be improved.

In some exemplary implementation modes, as shown in FIG. 3, orthographic projections of anodes of the green second light emitting elements 231 and 234 of the third display region A3 on a base substrate may be pentagonal, and orthographic projections of anodes of the red third light emitting element 232 and the blue third light emitting element 233 on the base substrate may be hexagonal. As shown in FIG. 3, orthographic projections of anodes of the green first light emitting elements 211 and 214 of the first display region A1 on the base substrate may be circular, and orthographic projections of anodes of the red first light emitting element 212 and the blue first light emitting element 213 on the base substrate may be in a shape of an ellipse. For example, the shape of the ellipse may be a combined shape of a square and two semicircles, wherein the two semicircles are connected at opposite ends of the square. In this example, by performing a corner smoothing design on an anode of a first light emitting element of the first display region A1, diffraction of a camera below a first display region of a display substrate when shooting may be reduced, thereby improving a shooting effect.

In some exemplary implementation modes, as shown in FIG. 4, a plurality of first light emitting elements of the first display region A1 and a plurality of second light emitting elements of the second display region A2 may be divided into a plurality of light emitting element groups according to different colors of light emit. Among them, light emitting elements within each light emitting element group are configured to emit light of a same color. At least one light emitting element group may include a plurality of sub light emitting element groups, and at least one sub light emitting element group may include two light emitting elements which are adjacent in the second direction Y and anodes of the two light emitting elements are connected. In this example, light emitting elements of the first display region A1 and the second display region A2 may be divided into following three groups: a green light emitting element group, a red light emitting element group, and a blue light emitting element group. At least one sub light emitting element group within the green light emitting element group includes two green light emitting elements adjacent in the second direction Y, and anodes of the two adjacent green light emitting elements are electrically connected through a first connection line L1. At least one sub light emitting element group within the red light emitting element group includes two red light emitting elements adjacent in the second direction Y, and anodes of the two adjacent red light emitting elements are electrically connected through a second connection line L2. At least one sub light emitting element group within the blue light emitting element group includes two blue light emitting elements adjacent in the second direction Y, and anodes of the two adjacent blue light emitting elements are electrically connected through a third connection line L3.

In some exemplary implementation modes, as shown in FIG. 4, at least one sub light emitting element group of the green light emitting element group within the first display region A1 may include green first light emitting elements 211 and 214 adjacent in the second direction Y, and anodes of the green first light emitting elements 211 and 214 are electrically connected through a first connection line L1. At least one sub light emitting element group of the red light emitting element group may include two red first light emitting elements 212 adjacent in the second direction Y, and anodes of the adjacent two red first light emitting elements 212 are electrically connected through a second connection line L2. At least one sub light emitting element group of the blue light emitting element group may include two blue first light emitting elements 213 adjacent in the second direction Y, and anodes of the two adjacent blue first light emitting elements 213 are electrically connected through a third connection line L3.

In some exemplary implementation modes, as shown in FIG. 4, at least one sub light emitting element group of the green light emitting element group within the second display region A2 may include green second light emitting elements 221 and 224 adjacent in the second direction Y, and anodes of the green second light emitting elements 221 and 224 are electrically connected through a first connection line L1. At least one sub light emitting element group of the red light emitting element group may include two red second light emitting elements 222 adjacent in the second direction Y, and the two adjacent red second light emitting elements 222 are electrically connected through a second connection line L2. At least one sub light emitting element group of the blue light emitting element group may include two blue second light emitting elements 223 adjacent in the second direction Y, and the two adjacent blue second light emitting elements 223 are electrically connected through a third connection line L3.

In some exemplary implementation modes, as shown in FIG. 4, at a junction of the first display region A1 and the second display region A2, at least one sub light emitting element group of the blue light emitting element group may include a blue first light emitting element 213 and a blue second light emitting element 223 adjacent in the second direction Y and the blue first light emitting element 213 and the blue second light emitting element 223 which are adjacent are electrically connected through a third connection line L3. At least one sub light emitting element group of the red light emitting element group may include a red first light emitting element 212 and a red second light emitting element 222 adjacent in the second direction Y, and the red first light emitting element 212 and the red second light emitting element 222 which are adjacent are electrically connected through a second connection line L2. However, this embodiment is not limited thereto.

In some exemplary implementation modes, as shown in FIG. 4, within the first display region A1 and the second display region A2, an extension direction of a first connection line L1 connecting adjacent green light emitting elements is substantially parallel to the second direction Y. An extension direction of a second connection line L2 connecting adjacent red light emitting elements intersects with the second direction Y. Further, in the first direction X, a plurality of second connection lines L2 may be divided into a second connection line group and extension directions of the plurality of second connection lines L2 within the second connection line group are substantially parallel. In the second direction Y, extension directions of connection lines of adjacent second connection line groups intersect. For example, a plurality of second connection lines L2 connecting red light emitting elements may be divided into a plurality of second connection line groups (i.e., a plurality of rows of second connection line groups), extension directions of second connection lines within a same second connection line group are substantially parallel, and extension directions of second connection lines within second connection line groups adjacent in the second direction Y intersect. An extension direction of a third connection line L3, connecting adjacent blue light emitting elements, intersects with the second direction Y. Further, in the first direction X, extension directions of a plurality of third connection lines L3 are substantially parallel. The plurality of third connection lines L3 substantially parallel in the first direction X are divided into a third connection line group. In the second direction Y, extension directions of third connection lines within third connection line groups which are adjacent intersect.

In this exemplary implementation mode, by electrically connecting anodes of adjacent light emitting elements of a same color within the first display region A1 and the second display region A2, two adjacent light emitting elements of a same color need to be driven by only one pixel circuit, which helps to achieve a consistent resolution in a display region. Moreover, for a blue light emitting element and a red light emitting element, anodes of adjacent light emitting elements of a same color are electrically connected along a crossing direction, and a display effect of the display region may be improved.

Figure 5:
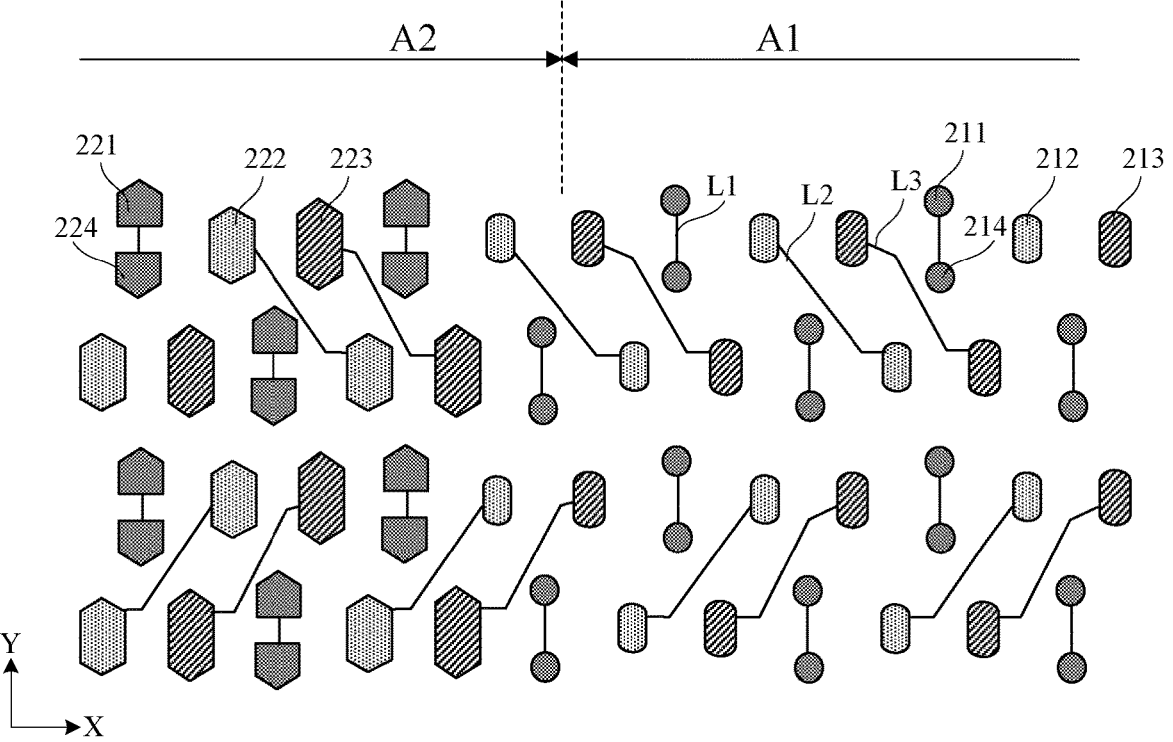
FIG. 5 is a schematic diagram of another arrangement of first light emitting elements in a first display region and second light emitting elements in a second display region according to at least one embodiment of the present disclosure.

FIG. 5 is a schematic diagram of another arrangement of first light emitting elements in a first display region and second light emitting elements in a second display region according to at least one embodiment of the present disclosure. In some exemplary implementation modes, as shown in FIGS. 3 and 5, a shape and an arrangement manner of a plurality of second light emitting elements 22 of a second display region A2 may be consistent with a shape and an arrangement manner of a plurality of third light emitting elements 23 of a third display region A3. In this example, at a junction of a first display region A1 and the second display region A2, shapes of green second light emitting elements 221 and 224 of the second display region A2 may be consistent with shapes of green first light emitting elements 211 and 214 of the first display region A1, and shapes of a red second light emitting elements 222 of the second display region A2 may be consistent with a shape of a red first light emitting element 212 of the first display region A1. However, this embodiment is not limited thereto. An arrangement structure and a connection relationship of light emitting elements of this embodiment may be referred to description of the foregoing embodiments, and thus will not be repeated herein.

In some exemplary implementation modes, circuit structures of a first pixel circuit, a second pixel circuit, and a third pixel circuit of a display region AA may be the same, for example, may all be a 3T1C (i.e., three transistors and one capacitor) structure, a 5T1C (i.e., five transistors and one capacitor) structure, or a 7T1C (i.e., seven transistors and one capacitor) structure. However, this embodiment is not limited thereto.

Figure 6:
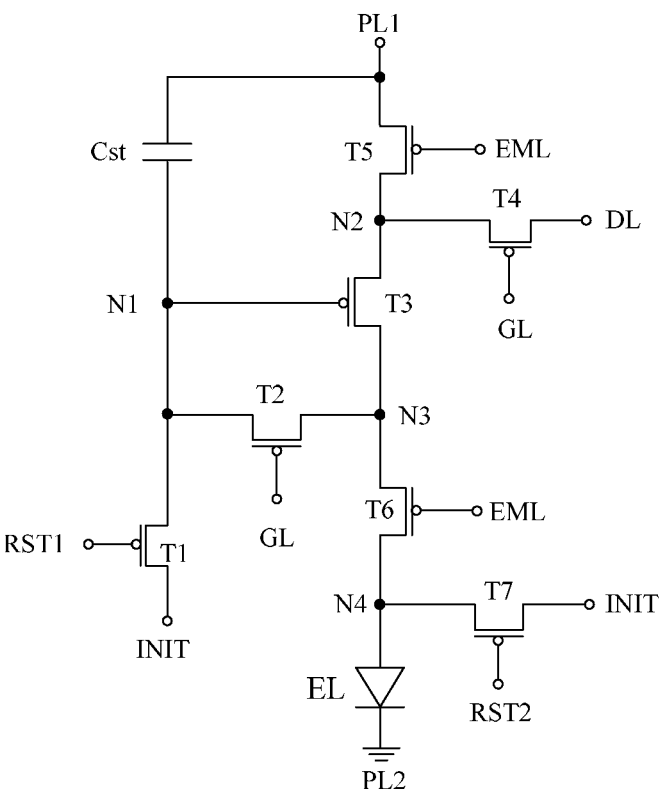
FIG. 6 is an equivalent circuit diagram of a pixel circuit according to at least one embodiment of the present disclosure.
Figure 7:
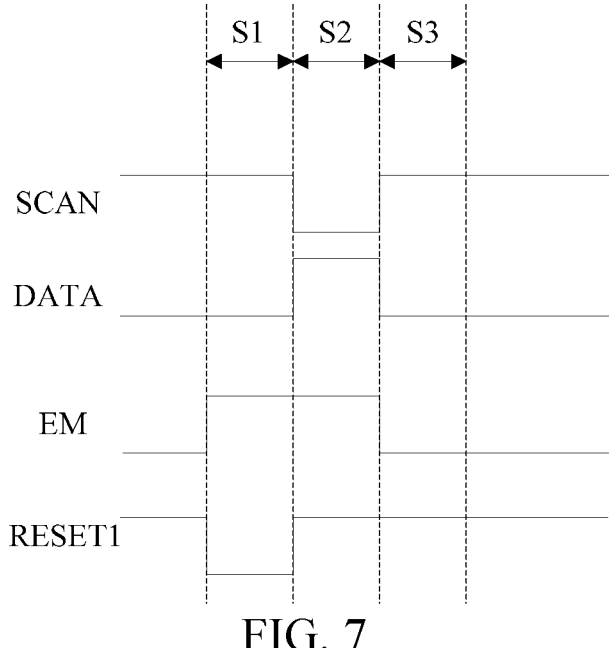
FIG. 7 is a working timing diagram of a pixel circuit according to at least one embodiment of the present disclosure.

FIG. 6 is an equivalent circuit diagram of a pixel circuit according to at least one embodiment of the present disclosure. FIG. 7 is a working timing diagram of a pixel circuit according to at least one embodiment of the present disclosure. The pixel circuit of this exemplary embodiment is of a 7T1C structure.

In some exemplary implementation modes, as shown in FIG. 6, the pixel circuit of this example includes six switching transistors (T1, T2, and T4 to T7), a drive transistor T3, and a storage capacitor Cst. The six switching transistors are respectively a data writing transistor T4, a threshold compensation transistor T2, a first light emitting control transistor T5, a second light emitting control transistor T6, a first reset transistor T1, and a second reset transistor T7. A light emitting element EL includes an anode, a cathode, and an organic emitting layer disposed between the anode and the cathode.

In some exemplary implementation modes, the drive transistor and the six switching transistors may be P-type transistors or may be N-type transistors. Using a same type of transistors in a pixel circuit may simplify a process flow, reduce a process difficulty of a display substrate, and improve a yield of products. In some possible implementation modes, the drive transistor and the six switching transistors may include a P-type transistor and an N-type transistor.

In some exemplary implementation modes, Low Temperature Poly Silicon thin film transistors, or oxide thin film transistors, or a Low Temperature Poly Silicon thin film transistor and an oxide thin film transistor may be adopted for the drive transistor and the six switching transistors. An active layer of a Low Temperature Poly Silicon thin film transistor is made of Low Temperature Poly Silicon (LTPS), and an active layer of an oxide thin film transistor is made of an oxide semiconductor (Oxide). A Low Temperature Poly Silicon thin film transistor has advantages such as a high mobility rate and fast charging, and an oxide thin film transistor has an advantage such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low-frequency drive, reduce power consumption, and improve display quality.

In some exemplary implementation modes, as shown in FIG. 6, the display substrate includes a scan line GL, a data line DL, a first power supply line PL1, a second power supply line PL2, a light emitting control line EML, an initial signal line INIT, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, and the first voltage signal VDD is greater than the second voltage signal VSS. The scan line GL is configured to provide a scan signal SCAN to the pixel circuit, the data line DL is configured to provide a data signal DATA to the pixel circuit, the light emitting control line EML is configured to provide a light emitting control signal EM to the pixel circuit, the first reset control line RST1 is configured to provide a first reset control signal RESET1 to the pixel circuit, and the second reset control line RST2 is configured to provide a second reset control signal RESET2 to the pixel circuit. In some examples, in a pixel circuit of an n-th row, a first reset control line RST1 may be electrically connected with a scan line GL of a pixel circuit of an (n−1)-th row to be inputted with a scan signal SCAN(n−1), that is, a first reset control signal RESET1($n$) is the same as the scan signal SCAN(n− 1). A second reset control line RST2 may be electrically connected with a scan line GL of the pixel circuit of the n-th row to be inputted with a scan signal SCAN(n), that is, a second reset control signal RESET2($n$) is the same as the scan signal SCAN(n). In some examples, a second reset control line RST2 with which the pixel circuit of the n-th row is electrically connected and a first reset control line RST1 with which a pixel circuit of the (n+1)-th row is electrically connected are of an integral structure. Thus, signal lines of the display substrate may be reduced, and a narrow bezel of the display substrate may be achieved. However, this embodiment is not limited thereto.

In some exemplary implementation modes, the initial signal line INIT is configured to provide an initial signal Vinit to the pixel circuit. For example, the initial signal Vinit may be a constant voltage signal, and its magnitude may be between a first voltage signal VDD and a second voltage signal VSS, but it is not limited to this. For example, the initial signal Vinit may be less than or equal to the second voltage signal VSS.

In some exemplary implementation modes, as shown in FIG. 6, the drive transistor T3 is electrically connected with the light emitting element EL, and outputs a drive current to drive the light emitting element EL to emit light under control of the scan signal SCAN, the data signal DATA, the first voltage signal VDD, and the second voltage signal VSS, etc. A gate of the data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of the threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of the first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the drive transistor T3. A gate of the second light emitting control transistor T6 is electrically connected with a light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. The first reset transistor T1 is electrically connected with the gate of the drive transistor T3 and configured to reset the gate of the drive transistor T3, and the second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with an initial signal line INIT, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with the initial signal line INIT, and a second electrode of the second reset transistor T7 is electrically connected with the anode of the light emitting element EL. A first electrode of the storage capacitor Cst is electrically connected with the gate of the drive transistor T3, and a second electrode of the storage capacitor Cst is electrically connected with the first power supply line PL1. In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

A working process of the pixel circuit illustrated in FIG. 6 will be described below with reference to FIG. 7. Description is given by taking a case in which a plurality of transistors included in the pixel circuit shown in FIG. 6 are all P-type transistors as an example.

In some exemplary implementation modes, as shown in FIG. 6, during one frame display time period, a working process of a pixel circuit of a first structure includes: a first stage S1, a second stage S2, and a third stage S3.

The first stage S1 is referred to as a reset stage. A first reset control signal RESET1 provided by the first reset control line RST1 is a low-level signal, so that the first reset transistor T1 is turned on, and an initial signal Vinit provided by the initial signal line INIT is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage S2 is referred to as a data writing stage or a threshold compensation stage. A scan signal SCAN provided by the scan line GL is a low-level signal, a first reset control signal RESET1 provided by the first reset control line RST1 and a light emitting control signal EM provided by the light emitting control line EML are both high-level signals, and the data line DL outputs a data signal DATA. In this stage, the second electrode of the storage capacitor Cst is at a low level, so that the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the second electrode (that is, the first node N1) of the storage capacitor Cst is Vdata-|Vth|, wherein Vdata is the data voltage output by the data line DL, and Vth is the threshold voltage of the drive transistor T3. The second reset transistor T7 is turned on, so that an initial signal Vinit provided by the initial signal line INIT is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

The third stage S3 is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Since the voltage of the first node N1 is Vdata-|Vth|, the drive current of the drive transistor T3 is as follows.

$$I = K \times (Vgs - Vth)^2 =$$

$$K \times [(VDD - Vdata + |Vth|) - Vth]^2 = K \times [(VDD - Vdata]^2$$

Among them, I is the drive current flowing through the drive transistor T3, that is to say, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

Figure 8:
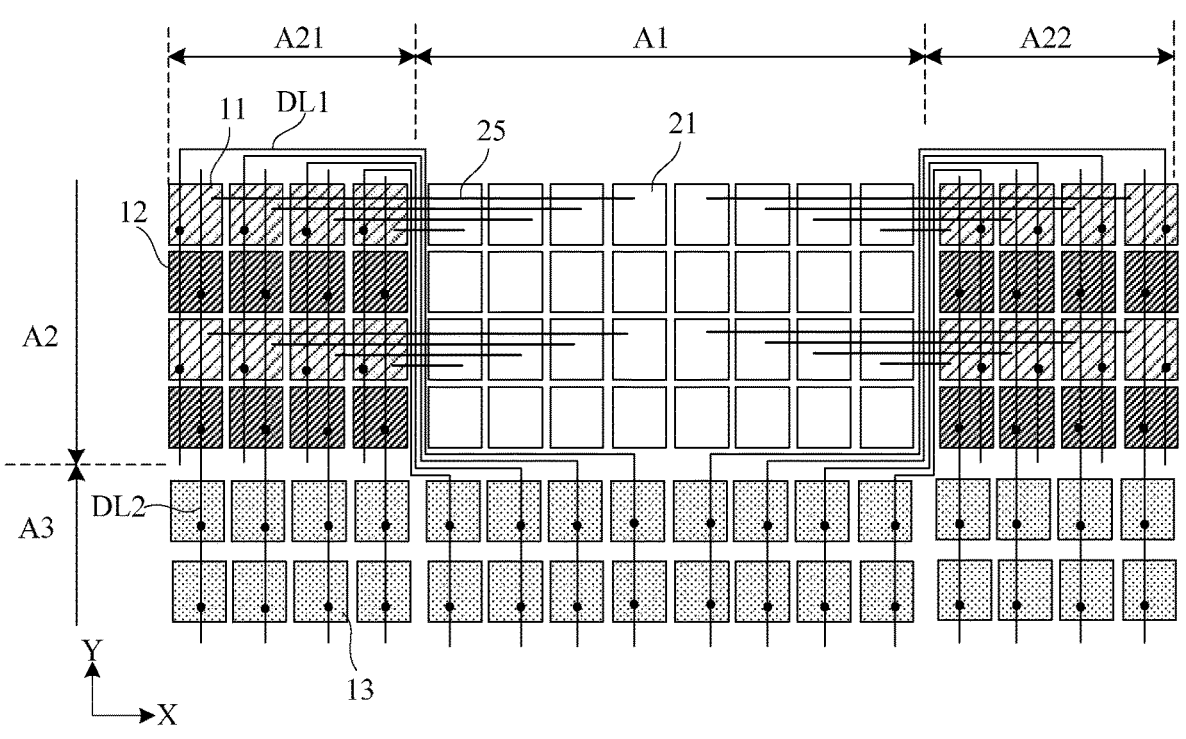
FIG. 8 is a schematic diagram of a partial trace of a first display region, a second display region, and a third display region according to at least one embodiment of the present disclosure.
Figure 9:
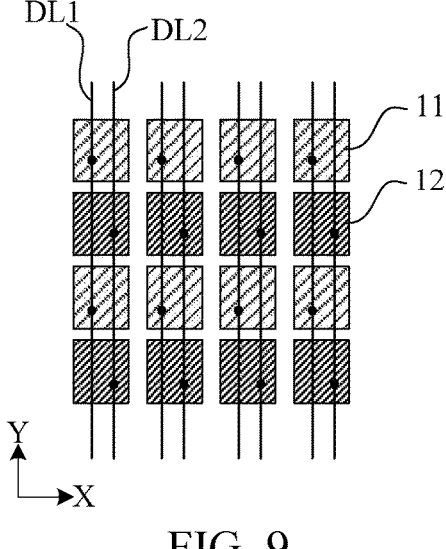
FIG. 9 is a schematic diagram of a partial trace of a second display region according to at least one embodiment of the present disclosure.

FIG. 8 is a schematic diagram of a partial trace of a first display region, a second display region, and a third display region according to at least one embodiment of the present disclosure. FIG. 9 is a schematic diagram of a partial trace of a second display region according to at least one embodiment of the present disclosure.

In some exemplary implementation modes, as shown in FIG. 8, a second display region A2 includes a first sub-display region A21 and a second sub-display region A22 located on opposite sides of a first display region A1 in a first direction X. The first sub-display region A21 and the second sub-display region A22 may be substantially symmetrical with respect to a center line of the first display region A1 in the first direction X. Description is given below by taking a trace between the first sub-display region A21 and the first display region A1 as an example.

In some exemplary implementation modes, as shown in FIG. 8, the first sub-display region A21 of the second display region A2 is provided with a plurality of pixel circuits arranged in a 2N× M array, wherein a quantity of rows of pixel circuits is 2N rows and a quantity of columns is M columns, and 2N rows of pixel circuits include N rows of first pixel circuits 11 and N rows of second pixel circuits 12. Among them, N and M are integers. In some examples, the N rows of first pixel circuits 11 and the N rows of second pixel circuits 12 are arranged at intervals in a second direction Y. For example, first pixel circuits 11 within the first sub-display region A21 are arranged in odd-numbered rows and second pixel circuits 12 are arranged in even-numbered rows. That is, within the first sub-display region A21, pixel circuits of a (2n+1)-th row include a plurality of first pixel circuits 11 configured to drive a plurality of first light emitting elements 21 (for example, two rows of first light emitting elements 21) of the first display region A1 to emit light, and pixel circuits of a 2n-th row include a plurality of second pixel circuits 12 configured to drive a plurality of second light emitting elements (for example, two rows of second light emitting elements) of the first sub-display region A21 to emit light. Among them, n is a natural number. However, this embodiment is not limited thereto.

In some exemplary implementation modes, as shown in FIGS. 8 and 9, a first pixel circuit 11 of the second display region A2 is electrically connected with a first data line DL1, and a second pixel circuit 12 of the second display region A2 is electrically connected with a second data line DL2. The first data line DL1 provides a first data signal and the second data line DL2 provides a second data signal, and the first data signal is different from the second data signal. Within the second display region A2, in the second direction Y, first pixel circuits 11 located in a same column are electrically connected with a same first data line DL1, and second pixel circuits 12 located in a same column are electrically connected with a same second data line DL2. The second data line DL2 electrically connected with second pixel circuits 12 in a same column extends in the second direction Y to a third display region A3 and is electrically connected with a column of third pixel circuits 13 of the third display region A3. The first data line DL1 electrically connected with first pixel circuits 11 in a same column extends to the third display region A3 after passing through a gap between the first display region A1 and the second display region A2, and is electrically connected with a column of third pixel circuits 13 within the third display region A3 on a lower side of the first display region A1.

In this exemplary implementation mode, as shown in FIG. 8, a second data line DL2 is electrically connected with a column of third pixel circuits 13 of the third display region A3 and a column of second pixel circuits 12 of the second display region A2, and a first data line DL1 is electrically connected with a column of third pixel circuits 13 of the third display region A3 and a column of first pixel circuits 11 of the second display region A2.

In some exemplary implementation modes, as shown in FIG. 8, a first light emitting element 21 of the first display region A1 and a first pixel circuit 11 electrically connected with the first light emitting element 21 may be located in a same row. That is, a drive signal of the first light emitting element 21 comes from the first pixel circuit 11 in the same row. In some examples, a first light emitting element 21 within the first display region A1 close to the second display region A2 is electrically connected with a first pixel circuit 11 within the second display region A2 close to the first display region A1 through a conductive line 25. In this example, lengths of a plurality of conductive lines 25 may not be consistent. However, this embodiment is not limited thereto. For example, lengths of a plurality of conductive lines electrically connecting a plurality of first light emitting elements and a plurality of first pixel circuits may be substantially the same.

In this exemplary implementation mode, by providing different data signals to a first pixel circuit 11 and a second pixel circuit 12, it may be ensured that a display effect of the first display region A1 after the first pixel circuit 11 is moved outward to the second display region A2 is substantially the same as a display effect when the first pixel circuit 11 is disposed in the first display region A1. Moreover, adjacent light emitting elements of a same color within the first display region A1 and the second display region A2 are driven by only one pixel circuit, so that a consistent resolution of the first display region A1 and the second display region A2 may be achieved without increasing pixel circuits of the second display region A2.

Figure 10:
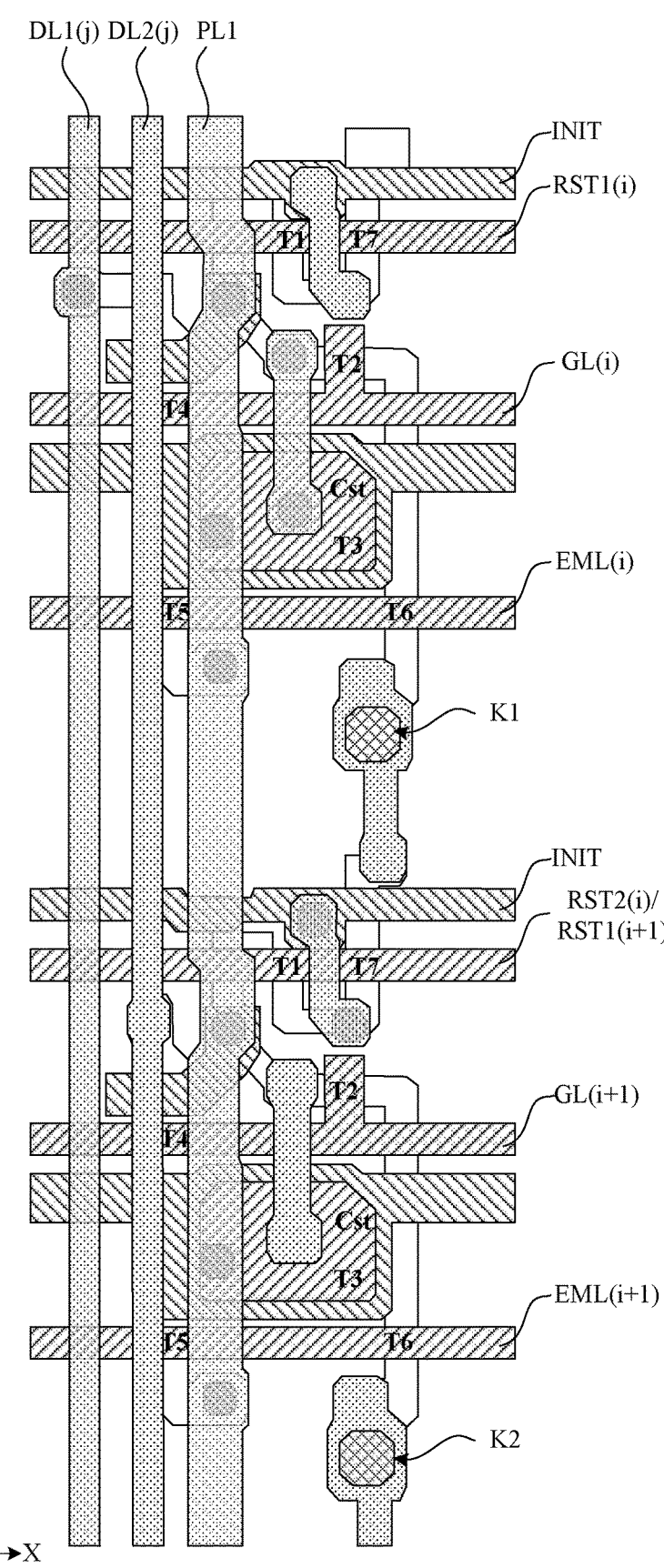
FIG. 10 is a plan schematic diagram of a first pixel circuit and a second pixel circuit of a display substrate according to at least one embodiment of the present disclosure.
Figure 11:
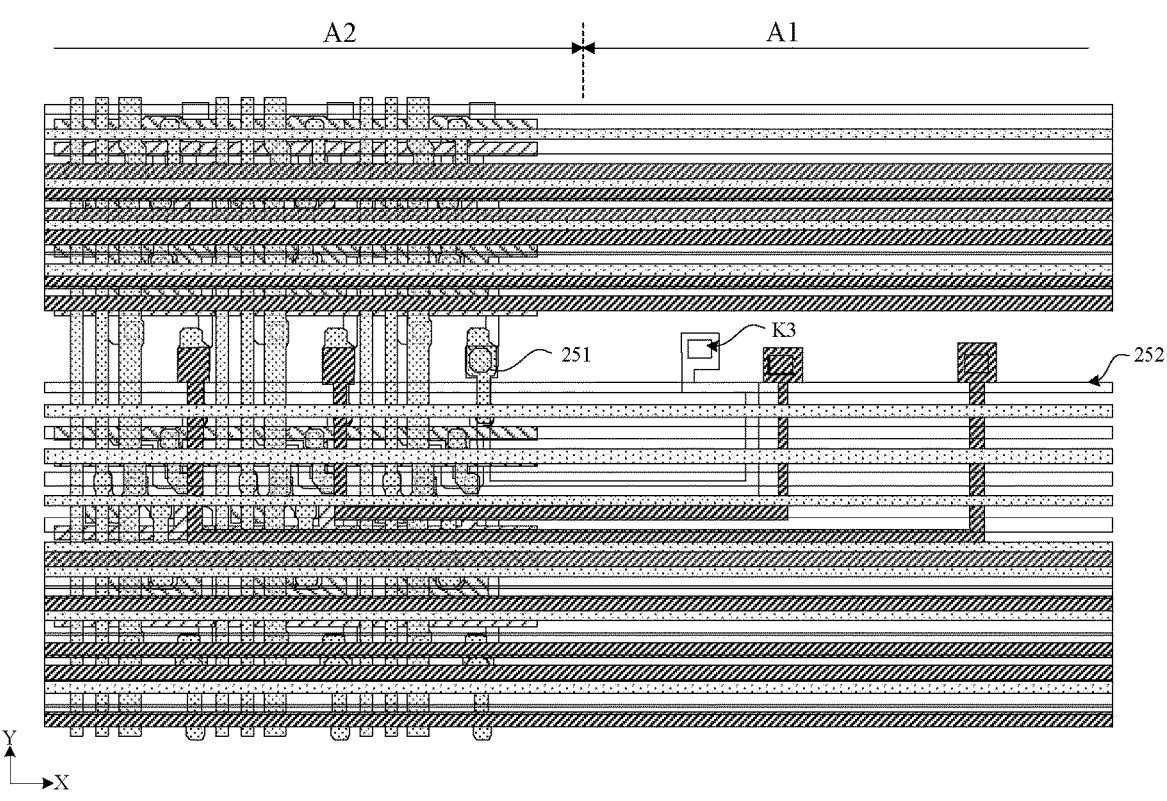
FIG. 11 is a partial plan schematic diagram of a first display region and a second display region of a display substrate according to at least one embodiment of the present disclosure.
Figure 12:
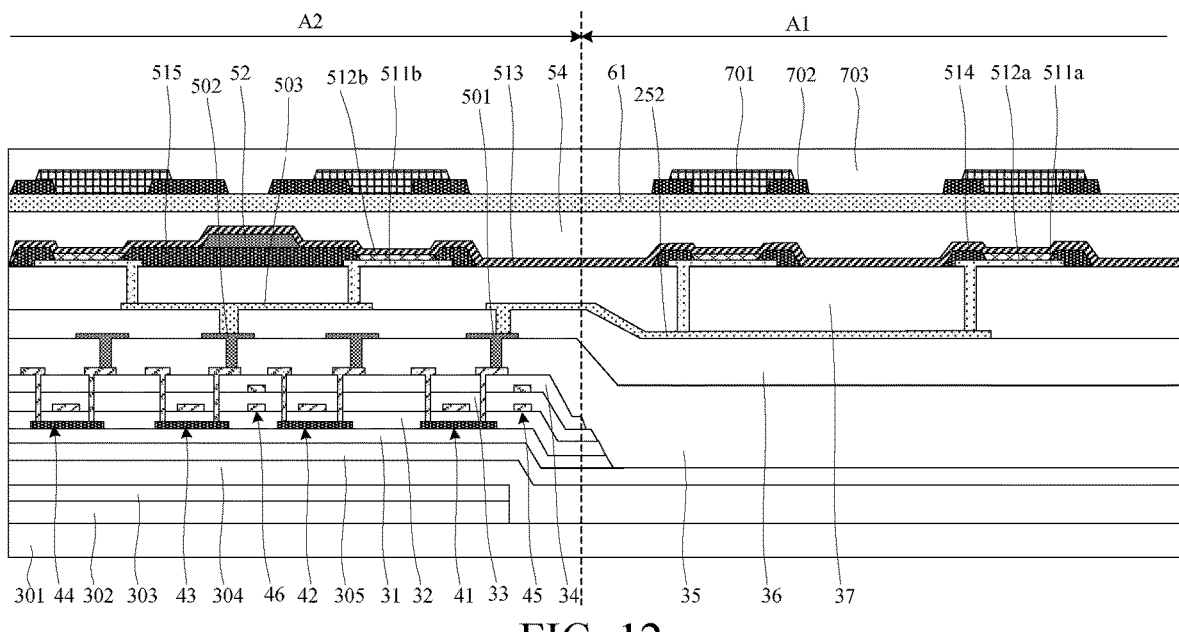
FIG. 12 is a partial sectional schematic diagram of a display substrate according to at least one embodiment of the present disclosure.

FIG. 10 is a plan schematic diagram of a pixel circuit of a display substrate according to at least one embodiment of the present disclosure. FIG. 11 is a partial plan schematic diagram of a first display region and a second display region of a display substrate according to at least one embodiment of the present disclosure. FIG. 12 is a schematic partial sectional view of a display substrate according to at least one embodiment of the present disclosure. FIG. 10 illustrates a planar structure of a first pixel circuit and a second pixel circuit located in a same column, and circuit structures of the first pixel circuit and the second pixel circuit are approximately the same, both are a 7T1C structure. FIG. 12 illustrates two first light emitting elements of a same color (e.g., green first light emitting elements) of a first display region A1, two second light emitting elements of a same color (e.g., red first light emitting elements) of a second display region A2, two transistors (e.g., a first transistor 41 and a second transistor 42) and one capacitor (e.g., a first capacitor 45) of a first pixel circuit of the second display region A2, and two transistors (e.g., a third transistor 43 and a fourth transistor

44) and one capacitor (e.g., a second capacitor 46) of a second pixel circuit of the second display region A2.

In some exemplary implementation modes, as shown in FIG. 10, a first pixel circuit in an i-th row and a j-th column is electrically connected with a first data line DL1($j$), and a second pixel circuit in an (i+1)-th row and the j-th column is electrically connected with a second data line DL2($j$). An active layer of a second reset transistor T7 of the first pixel circuit in the i-th row and the j-th column and an active layer of a first reset transistor T1 of the second pixel circuit in the (i+1)-th row and j-th column are of an integral structure. An active layer of a first reset transistor T1 of the first pixel circuit in the i-th row and the j-th column and an active layer of a second reset transistor T7 of a second pixel circuit in an (i−1)-th row and the j-th column are of an integral structure. Among them, both i and j are integers.

In some exemplary implementation modes, as shown in FIG. 10, scan lines GL(i) and GL(i+1), an initial signal line INIT, first reset control lines RST1($i$) and RST(i+1), a second reset control line RST2($i$), light emitting control lines EML(i) and EML(i+1) all extend along a first direction X, and the first data line DL1($j$), the second data line DL2($j$), and a first power supply line PL1 all extend along a second direction Y. In this example, the first reset control line RST1($i$+1) and the second reset control line RST2($i$) may be of an integral structure. However, this embodiment is not limited thereto.

In some exemplary implementation modes, as shown in FIG. 12, within a plane perpendicular to the display substrate, the second display region A2 may include a base substrate, a circuit structure layer disposed on the base substrate, a connection trace layer, a light emitting structure layer, an encapsulation layer, a touch structure layer, and a color film structure layer. The first display region A1 may include a base substrate, a connection trace layer disposed on the base substrate, a light emitting structure layer, an encapsulation layer, a touch control structure layer, and a color film structure layer. However, this embodiment is not limited thereto.

In some exemplary implementation modes, as shown in FIG. 12, the base substrate of the second display region A2 may include a substrate 301, a first flexible material layer 302, a first inorganic material layer 303, a second flexible material layer 304, and a second inorganic material layer 305 stacked sequentially. The base substrate of the first display region A1 may include a substrate 301, a second flexible material layer 304, and a second inorganic material layer 305 stacked sequentially. The first flexible material layer 302 and the first inorganic material layer 303 are removed from the base substrate of the first display region A1, which is beneficial to improve a light transmittance of the first display region A1.

In some exemplary implementation modes, the first flexible material layer 302 and the second flexible material layer 304 may be made of a material such as Polyimide (PI), Polyethylene Terephthalate (PET), or surface-treated polymer soft film, and the first inorganic material layer 303 and the second inorganic material layer 305 may be made of a material such as Silicon Nitride (SiNx) or Silicon Oxide (SiOx) configured to improve water and oxygen resistance of the substrate 301. The first inorganic material layer 303 and the second inorganic material layer 305 may be referred to as barrier layers.

In some exemplary implementation modes, as shown in FIG. 12, the first display region A1 is not provided with a circuit structure layer. The circuit structure layer of the second display region A2 may include a semiconductor layer, a first conductive layer, a second conductive layer, and a third conductive layer that are sequentially disposed on the base substrate. The semiconductor layer includes at least an active layer of the first transistor 41, an active layer of the second transistor 42, an active layer of the third transistor 43, and an active layer of the fourth transistor 44. The first conductive layer includes at least a gate of the first transistor 41, a gate of the second transistor 42, a gate of the third transistor 43, a gate of the fourth transistor 44, a first electrode of the first capacitor 45, and a first electrode of the second capacitor 46. The second conductive layer includes at least a second electrode of the first capacitor 45 and a second electrode of the second capacitor 46. The third conductive layer includes at least a first electrode and a second electrode of the first transistor 41, a first electrode and a second electrode of the second transistor 42, a first electrode and a second electrode of the third transistor 43, and a first electrode and a second electrode of the fourth transistor 44.

In some exemplary implementation modes, as shown in FIG. 12, a first insulation layer 31 is disposed between the semiconductor layer and the base substrate, a second insulation layer 32 is disposed between the semiconductor layer and the first conductive layer, a third insulation layer 33 is disposed between the first conductive layer and the second conductive layer, and a fourth insulation layer 34 is disposed between the second conductive layer and the third conductive layer. In some examples, the first insulation layer 31 is referred to as a buffer layer and is configured to improve water and oxygen resistance of the base substrate. The second insulation layer 32 and the third insulation layer 33 are referred to as gate insulation layers. The fourth insulation layer 34 is referred to as an interlayer dielectric layer. In some examples, the first insulation layer 31 to the fourth insulation layer 34 may be inorganic insulation layers. For example, the first insulation layer 31, the second insulation layer 32, the third insulation layer 33, and the fourth insulation layer 34 are made of any one or more of Silicon Oxide (SiOx), Silicon Nitride (SiNx), and Silicon Oxynitride (SiON), and may be a single layer, a multi-layer, or a composite layer. The first conductive layer, the second conductive layer, and the third second conductive layer may be made of a metal material, such as any one or more of Argentum (Ag), Copper (Cu), Aluminum (Al), Titanium (Ti), and Molybdenum (Mo), or an alloy material of the above metals, such as an Aluminum Neodymium alloy (AlNd) or a Molybdenum Niobium alloy (MoNb), and may be of a single-layer structure, or a multi-layer composite structure, such as Ti/Al/Ti. The semiconductor layer may be made of one or more materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene. That is, the present disclosure is applicable to a transistor manufactured based on an oxide technology, a silicon technology, and an organic matter technology.

In some exemplary implementation modes, as shown in FIG. 12, the connection trace layer of the second display region A2 may include a first connection layer and a second connection layer. The second connection layer is located on a side of the first connection layer away from the base substrate. The connection trace layer of the first display region A1 may include a second connection layer. A conductive line connecting a first pixel circuit and a first light emitting element may be located in a connection trace layer. For example, the conductive line may include a first conductive line located in the first connection layer and a second conductive line located in a second connection layer. An anode of a first light emitting element of the first display region A1 may be electrically connected with a first pixel circuit of the second display region A2 through a first conductive line, or may be electrically connected with a first pixel circuit of the second display region A2 through a second conductive line. In this example, an arrangement of conductive lines may be facilitated by providing conductive lines in two connection layers.

In some exemplary implementation modes, as shown in FIGS. 11 and 12, the first connection layer of the second display region A2 includes at least a plurality of connection electrodes (e.g., a first connection electrode 501 and a second connection electrode 502), a first conductive line 251. The second connection layer includes at least a connection electrode (e.g., a third connection electrode 503) and a second conductive line 252. The third connection electrode 503 is located in the second display region A2, and the first conductive line 251 and the second conductive line 252 may extend from the second display region A2 to the first display region A1. A fifth insulation layer 35 is disposed between the third conductive layer of the circuit structure layer and the first connection layer, and a sixth insulation layer 36 is disposed between the first connection layer and the second connection layer. In some examples, the fifth insulation layer 35 may be an inorganic or organic insulation layer, and the sixth insulation layer 36 may be an organic insulation layer. The first connection layer and the second connection layer, for example, may be made of a transparent conductive material such as ITO or IZO. However, this embodiment is not limited thereto.

In some exemplary implementation modes, as shown in FIGS. 10 to 12, the first connection electrode 501 of the second display region A2 is electrically connected with a second electrode of a first transistor 41 (e.g., the second light emitting control transistor T6) of a first pixel circuit through a via (e.g., a first via K1) on the fifth insulation layer 35, and the second connection electrode 502 is electrically connected with a second electrode of a third transistor 43 (e.g., the second light emitting control transistor) of a second pixel circuit through a via (e.g., a second via K2) on the fifth insulation layer 35. In the second display region A2, the third connection electrode 503 is electrically connected with the second connection electrode 502 through a via on the sixth insulation layer 36, and one end of the second conductive line 252 is electrically connected with the first connection electrode 501 through a via on the sixth insulation layer 36, and the other end extends to the first display region A1 to be electrically connected with an anode of a first light emitting element.

In some exemplary implementation modes, as shown in FIG. 12, the light emitting structure layer of the first display region A1 may include an anode layer, a first pixel definition layer 514, an organic emitting layer (e.g., an organic emitting layer 512*a*), and a cathode layer 513. The anode layer of the light emitting structure layer of the first display region A1 may include anodes of a plurality of first light emitting elements (e.g., anodes 512*a*). The light emitting structure layer of the second display region A2 may include an anode layer, a second pixel definition layer 515, an organic emitting layer (e.g., an organic emitting layer 512*b*), and a cathode layer 513. The anode layer of the second display region A2 may include anodes of a plurality of second light emitting elements (e.g., anodes 512*b*). A seventh insulation layer 37 is disposed between an anode layer of a display region and a second connection trace layer. In some examples, the seventh insulation layer 37 may be an organic insulation layer. The cathode layer of the first display region A1 and the cathode layer of the second display region A2 may be of an integral structure. In this example, a cathode layer of the display region may be a full-surface cathode. However, this embodiment is not limited thereto. For example, the cathode layer of the first display region may be a patterned cathode with a hollowed-out region.

Figure 13:
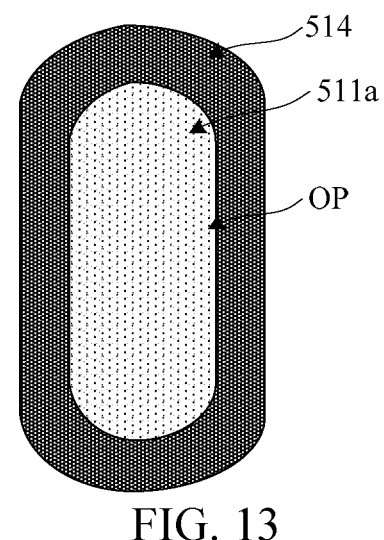
FIG. 13 is a plan schematic diagram of a first pixel definition block of a display substrate according to at least one embodiment of the present disclosure.

In some exemplary implementation modes, as shown in FIG. 12, the first pixel definition layer 514 may include a plurality of first pixel definition blocks that are independent of each other. The first pixel definition layer 514 may be black. FIG. 13 is a plan schematic diagram of a first pixel definition block of a display substrate according to at least one embodiment of the present disclosure. In some examples, the first pixel definition block has a first pixel definition opening OP which may expose an anode 511a of a first light emitting element. An orthographic projection of the first pixel definition opening OP on the base substrate may be in a shape of a circular ring. Adjacent first pixel definition blocks are not connected, and there is a light transmission region between adjacent first pixel definition blocks, which may provide a light channel for a photosensitive sensor (e.g., an under display camera) below the first display region. In this example, a black first pixel definition layer may absorb stray light to reduce an influence of diffraction. By providing a black first pixel definition layer, diffraction may be reduced and a shooting effect of the under display camera may be optimized.

In some exemplary implementation modes, as shown in FIG. 12, the second pixel definition layer 515 of the second display region A2 may have a plurality of second pixel definition openings exposing anodes of a plurality of second light emitting elements. The second pixel definition layer 515 may be transparent and continuous. In some examples, the first pixel definition layer 514 and the second pixel definition layer 515 may be sequentially prepared and formed through different steps. However, this embodiment is not limited thereto. For example, the second pixel definition layer and the first pixel definition layer may be made of a same black material and prepared simultaneously. In some examples, the first pixel definition layer 514 and the second pixel definition layer 515 may be made of a material such as polyimide, acrylic, or polyethylene terephthalate.

In some exemplary implementation modes, as shown in FIG. 12, anodes 511a of two first light emitting elements of a same color of the first display region A1 are electrically connected to the second conductive line 252 to be electrically connected with a first pixel circuit through the second conductive line 252 and the first connection electrode 501. Anodes 511b of two second light emitting elements of a same color of the second display region A2 are electrically connected to the third connection electrode 503 to be electrically connected with a second pixel circuit through the third connection electrode 503 and the second connection electrode 502. However, this embodiment is not limited thereto.

In some exemplary implementation modes, as shown in FIGS. 11 and 12, the first conductive line 251 may extend from the second display region A2 to the first display region A1. A first conductive line 251 of the second display region A2 may be electrically connected with a first pixel circuit through a via opened on the fifth insulation layer 35, and a first conductive line 251 of the first display region A1 may be electrically connected with anodes of two first light emitting elements of a same color through a via (e.g., a third via K3) opened on the sixth insulation layer 36 and the seventh insulation layer 37. A second conductive line 252 of the second display region A2 may be electrically connected with the first connection electrode 501 through a via opened on the sixth insulation layer 36 to be electrically connected with a first pixel circuit, and a second conductive line 252 of the first display region A1 may be electrically connected with anodes (e.g., anodes 512a) of two first light emitting elements of a same color through a via opened on the seventh insulation layer 37. In some examples, a conductive line electrically connecting a first pixel circuit and a first light emitting element and a connection line electrically connecting two adjacent first light emitting elements of a same color may be of an integral structure. However, this embodiment is not limited thereto. In this exemplary implementation mode, by providing two connection trace layers to arrange connection lines and conductive lines, an electrical connection between a first light emitting element of the first display region and a first pixel circuit of the second display region may be achieved, and an electrical connection between adjacent light emitting elements of a same color may also be achieved to facilitate an arrangement of traces.

In some exemplary implementation modes, any organic emitting layer may include a hole injection layer, a hole transport layer, an emitting layer, an electron transport layer, and an electron injection layer which are stacked. For example, an organic emitting layer 512b of a second light emitting element is formed in the second pixel definition opening of the second pixel definition layer 515 of the second display region A2, and an organic emitting layer 512a of the first light emitting element is formed in the first pixel definition opening of the first pixel definition layer 514 of the first display region A1. An organic emitting layer may be connected with an anode of a light emitting element. A cathode of a first light emitting element is formed on the first pixel definition layer 514 and is connected with the organic emitting layer 512a, and a cathode of a second light emitting element is formed on the second pixel definition layer 515 and is connected with the organic emitting layer 512b. In some examples, the cathode layer of the first display region A1 and the cathode layer of the second display region A2 may be of an integral structure. For example, a cathode layer may be a transparent cathode, for example, may be prepared using a transparent conductive material, such as ITO or IZO. In this example, a light emitting element may emit light from a side away from the base substrate through the transparent cathode, thus a top emission structure is achieved.

In some exemplary implementation modes, a Post Spacer (PS) layer is disposed on a side of the first pixel definition layer and the second pixel definition layer away from the base substrate, and the post spacer layer includes a plurality of first post spacers 53 located in the first display region A1 and a plurality of second post spacers 52 located in the second display region A2. In some examples, a density of the first post spacers 53 of the first display region A1 is less than a density of the second post spacers 52 of the second display region A2.

Figure 14:
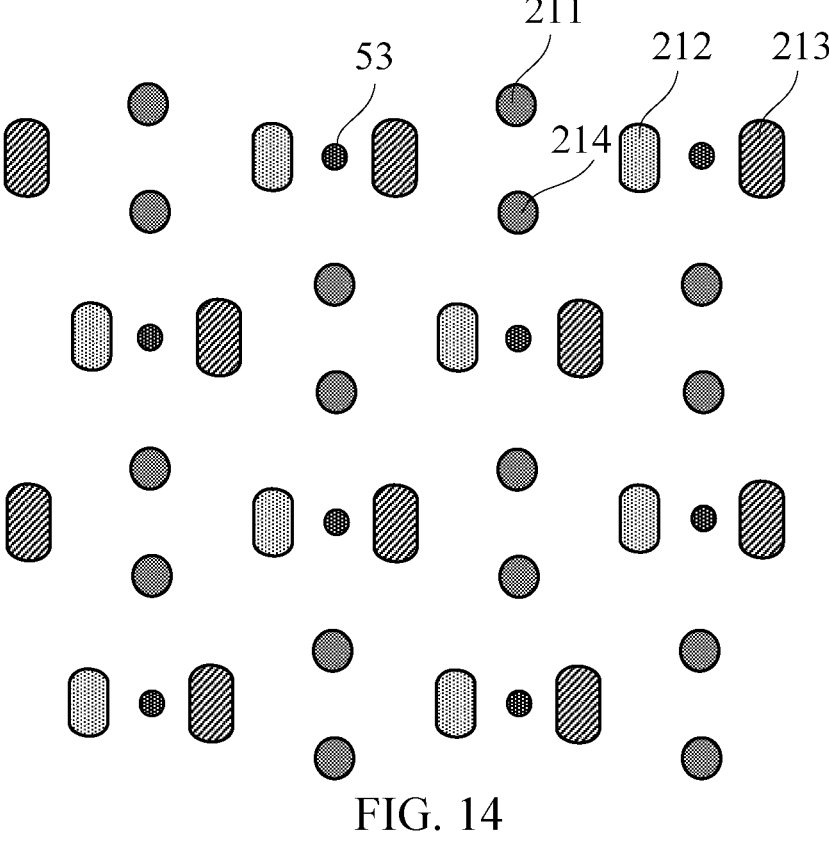
FIG. 14 is a partial plan schematic diagram of a first display region of a display substrate according to at least one embodiment of the present disclosure.

FIG. 14 is a partial plan schematic diagram of a first display region of a display substrate according to at least one embodiment of the present disclosure. As shown in FIG. 14, a first spacer post 53 may be disposed between adjacent pixel units within the first display region A1. An orthographic projection of the first post spacer 53 on the base substrate may be circular. As shown in FIG. 12, a second post spacer 52 may be disposed between adjacent light emitting elements within the second display region A2. An orthographic projection of the second post spacer 52 on the base substrate may be circular. However, this embodiment is not limited thereto. In this exemplary implementation mode, a light transmittance of the first display region may be improved by reducing a density of first post spacers within the first display region.

In some exemplary implementation modes, as shown in FIG. 12, an encapsulation layer 54 is disposed on a side of a cathode layer away from the base substrate. The encapsulation layer 54 may include a first encapsulation layer, second encapsulation layer, and a third encapsulation layer which are stacked. The first encapsulation layer is made of an inorganic material, the second encapsulation layer is made of an organic material, and the third encapsulation layer is made of an inorganic material, and covers the first encapsulation layer and the second encapsulation layer. However, this embodiment is not limited thereto. In some examples, the encapsulation layer may be of a five-layer structure of inorganic/organic/inorganic/organic/inorganic.

In some exemplary implementation modes, as shown in FIG. 12, a touch structure layer 61 is disposed on a side of the encapsulation layer 54 away from the base substrate. For example, the touch structure layer may include a bridge layer, a touch insulation layer, a touch layer, and a protective layer sequentially disposed on the encapsulation layer 54. For example, the touch layer may include a touch electrode, and the bridge layer may include a connection electrode connecting touch electrodes. However, this embodiment is not limited thereto.

In some exemplary implementation modes, as shown in FIG. 12, a color film structure layer is disposed on a side of the touch structure layer away from the base substrate. The color film structure layer may include a Black Matrix (BM) 702 disposed on the touch structure layer, a plurality of color filter units 701, and a protection (Over Coat (OC)) layer 703. The plurality of color filter units 701 may include red filter units, green filter units, and blue filter units disposed in a same layer and arranged periodically. The black matrix 702 is disposed in a gap region between adjacent filter units. The protective layer 703 may be prepared using a transparent organic material. The color filter units of the color film structure layer may correspond to light emitting elements of the light emitting structure layer one by one respectively, so that the light emitted by a light emitting element is emitted through a corresponding color filter unit. In this example, the black matrix 702 of the first display region A1 has a hollowed-out region to achieve light transmission, thereby improving a light transmittance of the first display region A1. In this exemplary embodiment, the color film structure layer is directly formed on the touch structure layer, so that the display substrate may be thinner and more flexible, and a light output efficiency may be improved and power consumption may be reduced.

In some exemplary implementation modes, third light emitting elements of a same color of a third display region do not need to be electrically connected, and a plurality of third pixel circuits are electrically connected with a plurality of third light emitting elements in one-to-one correspondence. Since a cross-sectional structure of the third display region is similar to that of the second display region, so it will not be repeated here.

In the display substrate provided by this exemplary embodiment, the first flexible material layer 302, the first inorganic material layer 303, the semiconductor layer, the second insulation layer 32, the first conductive layer, the third insulation layer 33, the second conductive layer, the fourth insulation layer 34, and the third conductive layer are removed from the first display region A1, so that the light transmittance of the first display region A1 may be improved. Furthermore, conductive lines and connection lines are arranged by using a first connection layer and a second connection layer made of a transparent conductive material, so that an arrangement of the traces may be facilitated and the light transmittance of the first display region A1 may be improved. A black and discontinuous first pixel definition layer is adopted in the first display region A1, which may not only provide a light transmission channel, but also absorb stray light, reduce an influence of diffraction and improve a shooting effect of a camera below the first display region.

Figure 15:
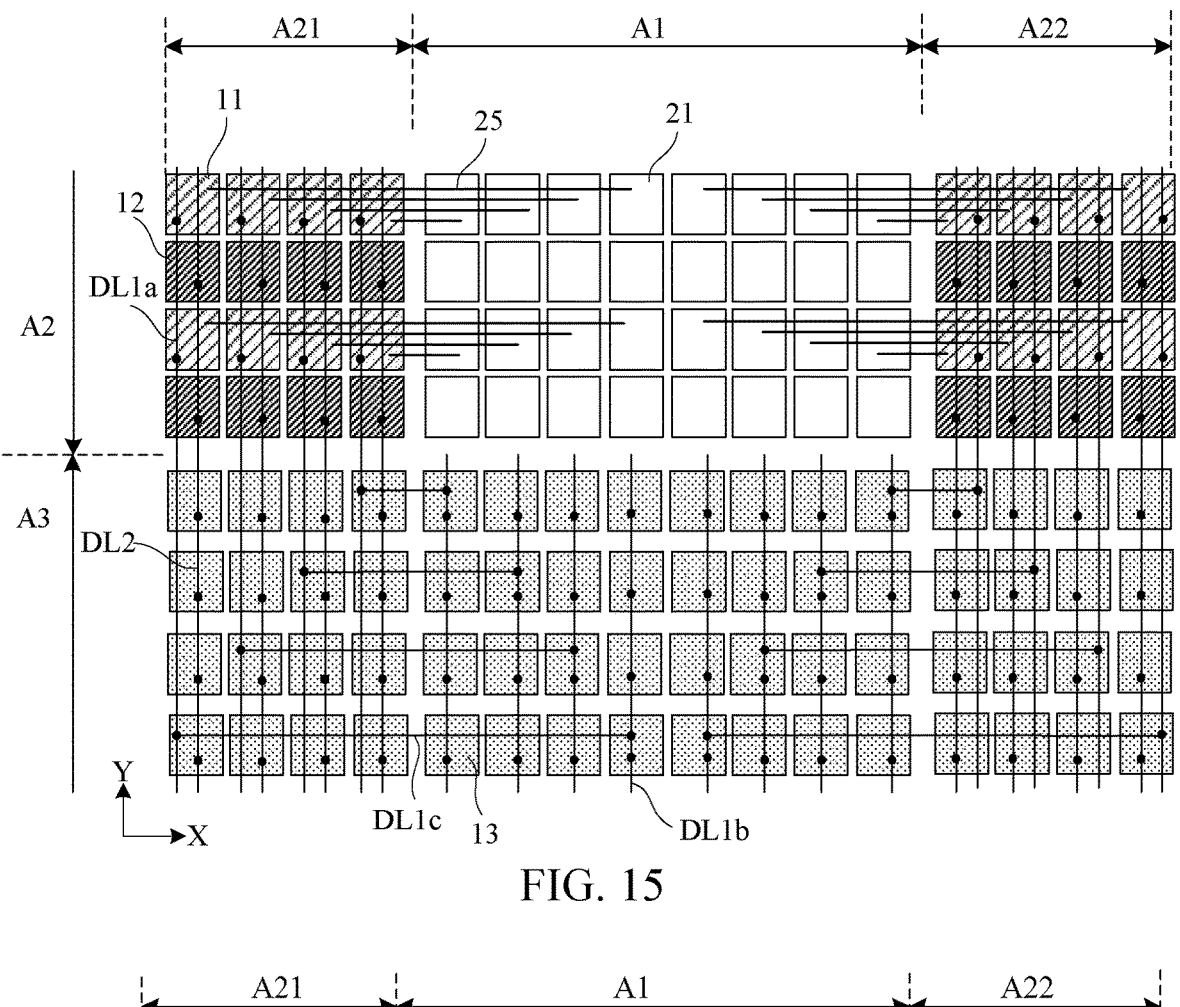
FIG. 15 is a schematic diagram of another partial trace of a first display region, a second display region, and a third display region according to at least one embodiment of the present disclosure.

FIG. 15 is a schematic diagram of another partial trace of a first display region, a second display region, and a third display region according to at least one embodiment of the present disclosure. In some exemplary implementation modes, as shown in FIG. 15, a second display region A2 includes a first sub-display region A21 and a second sub-display region A22 which are located on opposite sides of a first display region A1 in a first direction X. The first sub-display region A21 and the second sub-display region A22 may be substantially symmetrical with respect to a center line of the first display region A1 in the first direction X. Description is given below by taking a trace between the first sub-display region A21 and the first display region A1 as an example.

In some exemplary implementation modes, as shown in FIG. 15, a first pixel circuit 11 of the second display region A2 is electrically connected with a first data line, and a second pixel circuit 12 of the second display region A2 is electrically connected with a second data line DL2. Within the second display region A2, in a second direction Y, second pixel circuits 12 located in a same column are electrically connected with a same second data line DL2. A second data line DL2 electrically connected with second pixel circuits 12 in a same column extends in the second direction Y to a third display region A3 and is electrically connected with a column of third pixel circuits 13 of the third display region A3.

In some exemplary implementation modes, as shown in FIG. 15, the first data line includes a first sub-data line DL1$a$ and a second sub-data line DL1$b$. The first sub-data line DL1$a$ and the second sub-data line DL1$b$ are electrically connected through a data connection line DL1$c$. The first sub-data line DL1$a$ is electrically connected with a column of first pixel circuits 11 within the second display region A2 and extends in the second direction Y to the third display region A3, and is electrically connected with the data connection line DL1$c$ in the third display region A3. The second sub-data line DL1$b$ is electrically connected with a column of third pixel circuits 13 in the third display region A3 and is electrically connected with the data connection line DL1$c$. The data connection line DL1$c$ is located in the third display region A3 and extends along the first direction X to achieve an electrical connection between the first sub-data line DL1$a$ and the second sub-data line DL1$b$.

In some examples, the first sub-data line DL1$a$ and the second sub-data line DL1$b$ may be of a structure of a same layer, and the data connection line DL1$c$ may be located on a side of the first sub-data line DL1$a$ away from a base substrate. For example, the first sub-data line DL1$a$ and the second sub-data line DL1$b$ may be located in a third conductive layer and the data connection line DL1$c$ may be located in a first connection layer. However, this embodiment is not limited thereto.

Rest of a structure of a display substrate according to this embodiment may be referred to description of the aforementioned embodiments, and will not be repeated here.

In the exemplary implementation mode, by achieving transmission of a first data signal in the third display region A3, over-dense traces arranged in a gap between the first display region A1 and the second display region A2, thereby facilitating a reasonable arrangement of traces.

Figure 16:
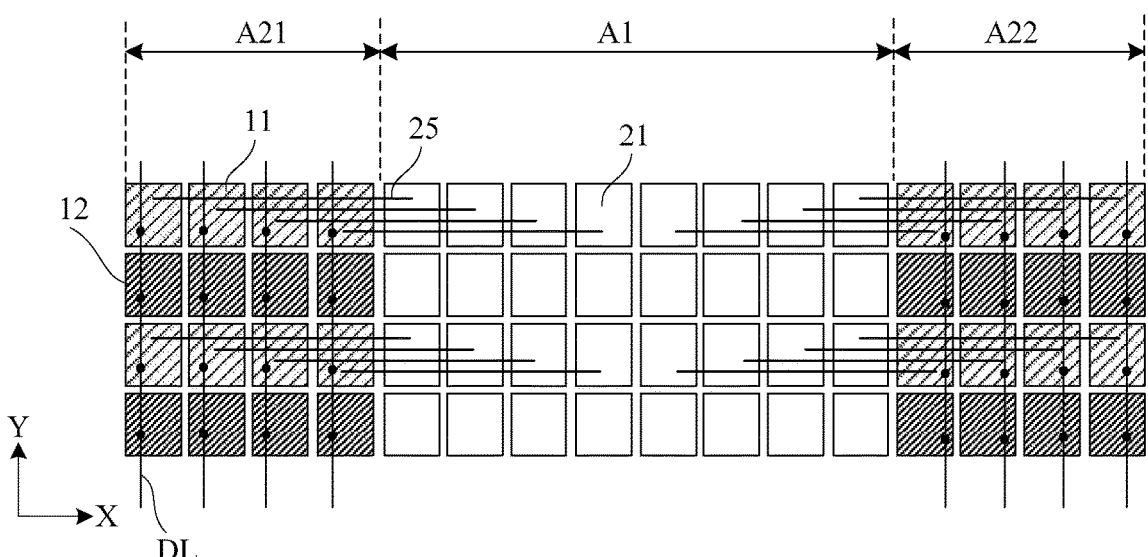
FIG. 16 is a schematic diagram of another partial trace of a first display region and a second display region according to at least one embodiment of the present disclosure.

FIG. 16 is a schematic diagram of another partial trace of a first display region and a second display region according to at least one embodiment of the present disclosure. In some exemplary implementation modes, as shown in FIG. 16, a second display region A2 includes a first sub-display region A21 and a second sub-display region A22 which are located on opposite sides of a first display region A1 in a first direction X. The first sub-display region A21 and the second sub-display region A22 may be substantially symmetrical with respect to a center line of the first display region A1 in the first direction X. Description is given below by taking a trace between the first sub-display region A21 and the first display region A1 as an example.

In some exemplary implementation modes, a first pixel circuit 11 of the second display region A2 is electrically connected with a data line DL, and a second pixel circuit 12 of the second display region A2 is electrically connected with the data line DL. The data line DL is electrically connected with a column of first pixel circuits 11 and second pixel circuits 12 in the second display region A2. The data line DL may provide a first data signal and a second data signal in time-sharing. For example, a row drive circuit may generate a drive signal provided to pixel circuits in odd-numbered rows such that the pixel circuits (e.g., the first pixel circuits) in odd-numbered rows use the first data signal to drive first light emitting elements of the first display region to emit light; the row drive circuit generates a drive signal provided to pixel circuits in even-numbered rows such that the pixel circuits (e.g., the second pixel circuits) in even-numbered rows use the second data signal to drive second light emitting elements of the second display region to emit light. In this way, a first light emitting element and a second light emitting element may be controlled to emit light in time-sharing by using one data line.

In some exemplary implementation modes, the data line DL of the second display region A2 extends along a second direction Y to a third display region and is electrically connected with a column of third pixel circuits of the third display region.

In some exemplary implementation modes, as shown in FIG. 16, lengths of a plurality of conductive lines 25 electrically connected between the first pixel circuits 11 and the first light emitting elements 21 may be substantially the same. For example, a first pixel circuit 11 away from the first display region A1 is electrically connected with a first light emitting element 21 close to the second display region A2 through a conductive line, and a first light emitting element 21 away from the second display region A2 is electrically connected with a first pixel circuit 11 close to the first display region A1 through a conductive line. However, this embodiment is not limited thereto.

In some exemplary implementation modes, the first data signal and the second data signal are provided in time-sharing through a data line, so that data signals of first light emitting elements of the first display region and third light emitting elements in a same column within the third display region may be consistent, thereby ensuring that a display effect after a first pixel circuit is removed from the first display region is substantially the same as a display effect when the first pixel circuit is remained in the first display region.

Rest of a structure of a display substrate according to this embodiment may be referred to description of the aforementioned embodiments, and will not be repeated here.

An embodiment of the present disclosure further provides a display apparatus, which includes the aforementioned display substrate.

Figure 17:
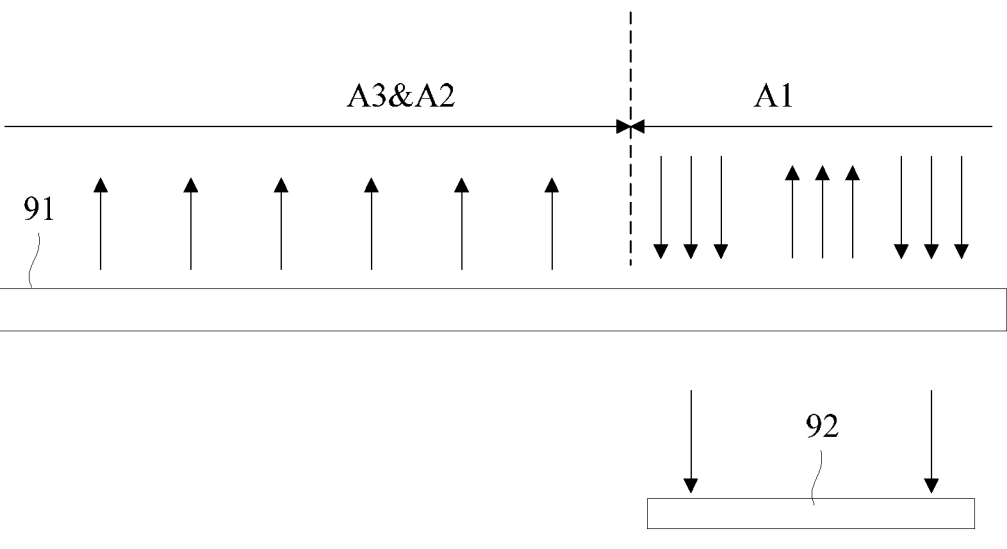
FIG. 17 is a schematic diagram of a display apparatus according to at least one embodiment of the present disclosure.

FIG. 17 is a schematic diagram of a display apparatus according to at least one embodiment of the present disclosure. As shown in FIG. 17, this embodiment provides a display apparatus, which includes a display substrate 91 and a photosensitive sensor 92 located on a light exiting side of a display structure layer away from the display substrate 91. An orthographic projection of the photosensitive sensor 92 on the display substrate 91 is overlapped with an orthographic projection of a first display region A1.

In some examples, the display substrate 91 may be a flexible OLED display substrate, a Quantum dot Light Emitting Diode (QLED) display substrate, a Micro-LED display substrate, or a Mini-LED display substrate. The display apparatus may be any product or component with a display function such as an OLED display, a cell phone, a tablet, a television, a display, a laptop, a digital photo frame, a navigator, and so on, which is not limited in the embodiment of the present disclosure.

The drawings of the present disclosure only involve structures involved in the present disclosure, and other structures may be referred to conventional designs. The embodiments of the present disclosure, i.e., features in the embodiments, may be combined with each other to obtain new embodiments if there is no conflict.

Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising:
   a base substrate, having a first display region and a second display region, wherein the second display region is located on at least one side of the first display region;
   a plurality of first light emitting elements located in the first display region; and
   a plurality of first pixel circuits, a plurality of second pixel circuits, and a plurality of second light emitting elements located in the second display region,
   wherein at least one first pixel circuit among the plurality of first pixel circuits is electrically connected with at least one first light emitting element among the plurality of first light emitting elements through a conductive line, at least one second pixel circuit among the plurality of second pixel circuits is electrically connected with at least one second light emitting element among the plurality of second light emitting elements, an orthographic projection of the at least one second pixel circuit on the base substrate is at least partially overlapped with an orthographic projection of the at least one second light emitting element on the base substrate;
   wherein the at least one first pixel circuit is configured to use a first data signal to drive the electrically connected at least one first light emitting element to emit light; the at least one second pixel circuit is configured to use a second data signal to drive the electrically connected at least one second light emitting element to emit light;
   wherein the first data signal is different from the second data signal-;

wherein the base substrate further comprises a third display region, and the third display region at least partially surrounds the first display region and the second display region;

wherein the display substrate further comprises a plurality of third pixel circuits and a plurality of third light emitting elements located in the third display region, at least one third pixel circuit among the plurality of third pixel circuits is electrically connected with at least one third light emitting element among the plurality of third light emitting elements, an orthographic projection of the at least one third pixel circuit on the base substrate is at least partially overlapped with an orthographic projection of the at least one third light emitting element on the base substrate; and wherein a ratio of an area of an anode of the first light emitting element to an area of an anode of a third light emitting element which emits light of a same color is greater than or equal to 30% and less than or equal to 80%.

2. The display substrate according to claim 1, wherein the at least one first pixel circuit and the at least one second pixel circuit are electrically connected with a same data line, and the same data line provides the first data signal and the second data signal in time-sharing.

3. The display substrate according to claim 1, wherein the at least one first pixel circuit is electrically connected with a first data line, and the at least one second pixel circuit is electrically connected with a second data line, the first data line provides the first data signal, and the second data line provides the second data signal.

4. The display substrate according to claim 3, wherein a plurality of pixel circuits of the second display region comprise: a plurality of rows of first pixel circuits arranged along a second direction, and a plurality of rows of second pixel circuits arranged along the second direction;

in the second direction, the plurality of rows of first pixel circuits and the plurality of rows of second pixel circuits are arranged at intervals, each row of first pixel circuits comprises a plurality of the first pixel circuits arranged sequentially along a first direction, and each row of the second pixel circuits comprises a plurality of the second pixel circuits arranged sequentially along the first direction; the first direction intersects with the second direction.

5. The display substrate according to claim 4, wherein within the second display region, a plurality of the first pixel circuits arranged along the second direction are electrically connected with a same first data line, and a plurality of the second pixel circuits arranged along the second direction are electrically connected with a same second data line.

6. The display substrate according to claim 1, wherein at least one light emitting element comprises: an anode, a cathode, and an organic emitting layer disposed between the anode and the cathode;

an area of an anode of the first light emitting element is smaller than or equal to an area of an anode of a second light emitting element which emits light of a same color.

7. The display substrate according to claim 1, wherein an orthographic projection of the anode of the first light emitting element on the base substrate is elliptical or circular, and an orthographic projection of the anode of the third light emitting element on the base substrate is hexagonal or pentagonal.

8. The display substrate according to claim 1, wherein resolutions of the third display region, the second display region, and the first display region are substantially the same.

9. The display substrate according to claim 1, wherein a second data line is electrically connected with a column of second pixel circuits in the second display region, extends along a second direction to the third display region, and is electrically connected with a column of third pixel circuits within the third display region;

a first data line is electrically connected with a column of first pixel circuits in the second display region, and extends from a gap between the first display region and the second display region to the third display region, and is electrically connected with a column of third pixel circuits within the third display region.

10. The display substrate according to claim 1, wherein a second data line is electrically connected with a column of second pixel circuits in the second display region, extends along a second direction to the third display region, and is electrically connected with a column of third pixel circuits within the third display region;

a first data line comprises a first sub-data line and a second sub-data line; the first sub-data line is electrically connected with a column of first pixel circuits in the second display region and extends to the third display region along the second direction, and is electrically connected with the second sub-data line through a data connection line in the third display region; the second sub-data line is electrically connected with a column of third pixel circuits within the third display region.

11. The display substrate according to claim 10, wherein the data connection line is located in the third display region and extends along a first direction.

12. The display substrate according to claim 1, wherein the plurality of first light emitting elements of the first display region and the plurality of second light emitting elements of the second display region are divided into a plurality of light emitting element groups, and light emitting elements within each of the light emitting element groups are configured to emit light of a same color;

at least one light emitting element group among the plurality of light emitting element groups comprises a plurality of sub light emitting element groups, and at least one sub light emitting element group among the plurality of sub light emitting element groups comprises at least two adjacent light emitting elements, anodes of the at least two adjacent light emitting elements are connected through a connection line.

13. The display substrate according to claim 12, wherein extension directions of a plurality of data lines connected with a same light emitting element group are substantially parallel; or, a plurality of data lines connected with a same light emitting element group are divided into a plurality of connection line groups, each of the connection line groups comprises a plurality of connection lines which are arranged sequentially along a first direction and have substantially parallel extension directions; extension directions of connection lines of adjacent connection line groups intersect.

14. The display substrate according to claim 13, wherein the plurality of light emitting element groups comprise: a green light emitting element group, a red light emitting element group, and a blue light emitting element group;

extension directions of a plurality of connection lines electrically connected with the green light emitting element group are substantially parallel; extension directions of connection lines of adjacent connection line groups among a plurality of connection line groups connected with the red light emitting element group intersect; extension directions of connection lines of adjacent connection line groups among a plurality of connection line groups connected with the blue light emitting element group intersect.

15. The display substrate according to claim 12, wherein connection lines are made of a transparent conductive material.

16. The display substrate according to claim 1, further comprising: a black first pixel definition layer located in the first display region, wherein the first pixel definition layer is at least partially located on a side of an anode of the first light emitting element away from the base substrate;

the first pixel definition layer comprises a plurality of first pixel definition blocks that are independent of each other; the plurality of first pixel definition blocks of the first display region correspond to anodes of the plurality of first light emitting elements one by one, and the first pixel definition blocks have first pixel definition openings exposing anodes of corresponding first light emitting elements.

17. The display substrate according to claim 16, wherein an orthographic projection of the first pixel definition openings on the base substrate is in a shape of a circular ring.

18. A display apparatus, comprising the display substrate according to claim 1.

19. The display apparatus according to claim 18, further comprising: a photosensitive sensor located on a side of the display substrate, wherein an orthographic projection of the photosensitive sensor on the display substrate is overlapped with the first display region of the display substrate.

\* \* \* \* \*